US012666932B2

(12) United States Patent
Peng et al.

(10) Patent No.: US 12,666,932 B2
(45) Date of Patent: Jun. 23, 2026

(54) METHOD OF FORMING SEMICONDUCTOR DEVICE

(71) Applicant: TAIWAN SEMICONDUCTOR MANUFACTURING COMPANY LTD., Hsinchu (TW)

(72) Inventors: Shih-Wei Peng, Hsinchu City (TW); Wei-Cheng Lin, Taichung City (TW); Jiann-Tyng Tzeng, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 1029 days.

(21) Appl. No.: 17/809,905

(22) Filed: Jun. 30, 2022

(65) Prior Publication Data

US 2022/0336261 A1 Oct. 20, 2022

Related U.S. Application Data

(62) Division of application No. 16/509,433, filed on Jul. 11, 2019, now Pat. No. 11,515,197.

(51) Int. Cl.
*H10W 15/00* (2026.01)
*H10D 30/01* (2025.01)
(Continued)

(52) U.S. Cl.
CPC .......... *H10W 15/00* (2026.01); *H10D 30/024* (2025.01); *H10D 86/011* (2025.01);
(Continued)

(58) Field of Classification Search
CPC .......... H10D 84/0158; H10D 84/0193; H10D 84/834; H10D 84/853; H10D 86/011; H10D 86/215; H10D 30/024; H10D 30/0241; H10D 30/0243; H10D 30/0245; H10D 30/62; H10D 30/6211; H10D 30/6212; H10D 30/6213; H10D 30/6215; H10D 30/6217; H10D 30/6218; H10D 30/6219; H10D 84/013–0133; H10D 84/0128; H10D 84/017; H10D 84/0149; H10D 84/0167; H10D 84/0186; H10D 62/021; H10D 62/149–161; H10D 62/299; H10D 62/307; H10D 30/0277; H10D 30/0218; H10D 30/0219; H10D 30/022; H10D 30/601–608; H10D 30/6715–6721;
(Continued)

(56) References Cited

U.S. PATENT DOCUMENTS 9,698,058 B2 * 7/2017 Ching ................ H10D 84/0193
2009/0315154 A1 * 12/2009 Kirby ................. H10W 20/021
257/E21.627
(Continued)

*Primary Examiner* — Wael M Fahmy
*Assistant Examiner* — Quinton A Brasfield
(74) *Attorney, Agent, or Firm* — WPAT LAW; Anthony King

(57) ABSTRACT

A method of forming a semiconductor device includes forming a wafer having an ion-implanted silicon layer, wherein the ion-implanted silicon layer is disposed between a first insulator layer and a second insulator layer inside the wafer; forming an active region over the ion-implanted silicon layer; forming an active device in the active region; and forming a conductive via to couple the ion-implanted silicon layer and the active device.

20 Claims, 39 Drawing Sheets

(51) Int. Cl.

| | |
|---|---|
| *H10D 86/00* | (2025.01) |
| *H10D 86/01* | (2026.01) |
| *H10P 90/00* | (2026.01) |
| *H10W 10/00* | (2026.01) |
| *H10W 10/10* | (2026.01) |
| *H10W 10/17* | (2026.01) |
| *H10W 20/00* | (2026.01) |
| *H10W 20/20* | (2026.01) |
| *H10W 20/40* | (2026.01) |

(52) U.S. Cl.
CPC ....... *H10D 86/215* (2025.01); *H10P 90/1906* (2026.01); *H10P 90/1908* (2026.01); *H10W 10/014* (2026.01); *H10W 10/061* (2026.01); *H10W 10/17* (2026.01); *H10W 10/181* (2026.01); *H10W 15/01* (2026.01); *H10W 20/083* (2026.01); *H10W 20/20* (2026.01); *H10W 20/40* (2026.01)

(58) Field of Classification Search
CPC . H10D 30/0223–0229; H10D 30/0215; H10D 30/0221; H10D 64/251–259; H10D 64/647–649; H01L 23/49827; H01L 23/5384; H01L 23/481; H01L 2224/08165; H01L 2224/16165; H01L 2224/16235; H01L 2224/32165; H01L 2224/32235; H01L 2224/40165; H01L 2224/40235; H01L 2224/48165; H01L 2224/48235; H01L 2225/06541–06544; H01L 2225/06548; H01L 21/76898; H01L 21/486; H01L 21/74; H10B 12/36; H10B 12/056; H10W 90/20–297; H10W 90/701–798; H10W 20/051; H10P 14/3438–3448; H10P 30/00–40; H10P 32/1406; C23C 14/48
See application file for complete search history.

(56) References Cited

U.S. PATENT DOCUMENTS

| | | | | |
|---|---|---|---|---|
| 2012/0038030 A1* | 2/2012 | Frey | .................... | H10W 20/023 |
| | | | | 257/E21.546 |
| 2015/0162405 A1* | 6/2015 | Yang | .................... | H10D 62/307 |
| | | | | 438/285 |
| 2017/0179244 A1* | 6/2017 | Radens | ................ | H10D 62/121 |
| 2018/0097076 A1* | 4/2018 | Cheng | ................. | H10D 64/259 |

* cited by examiner

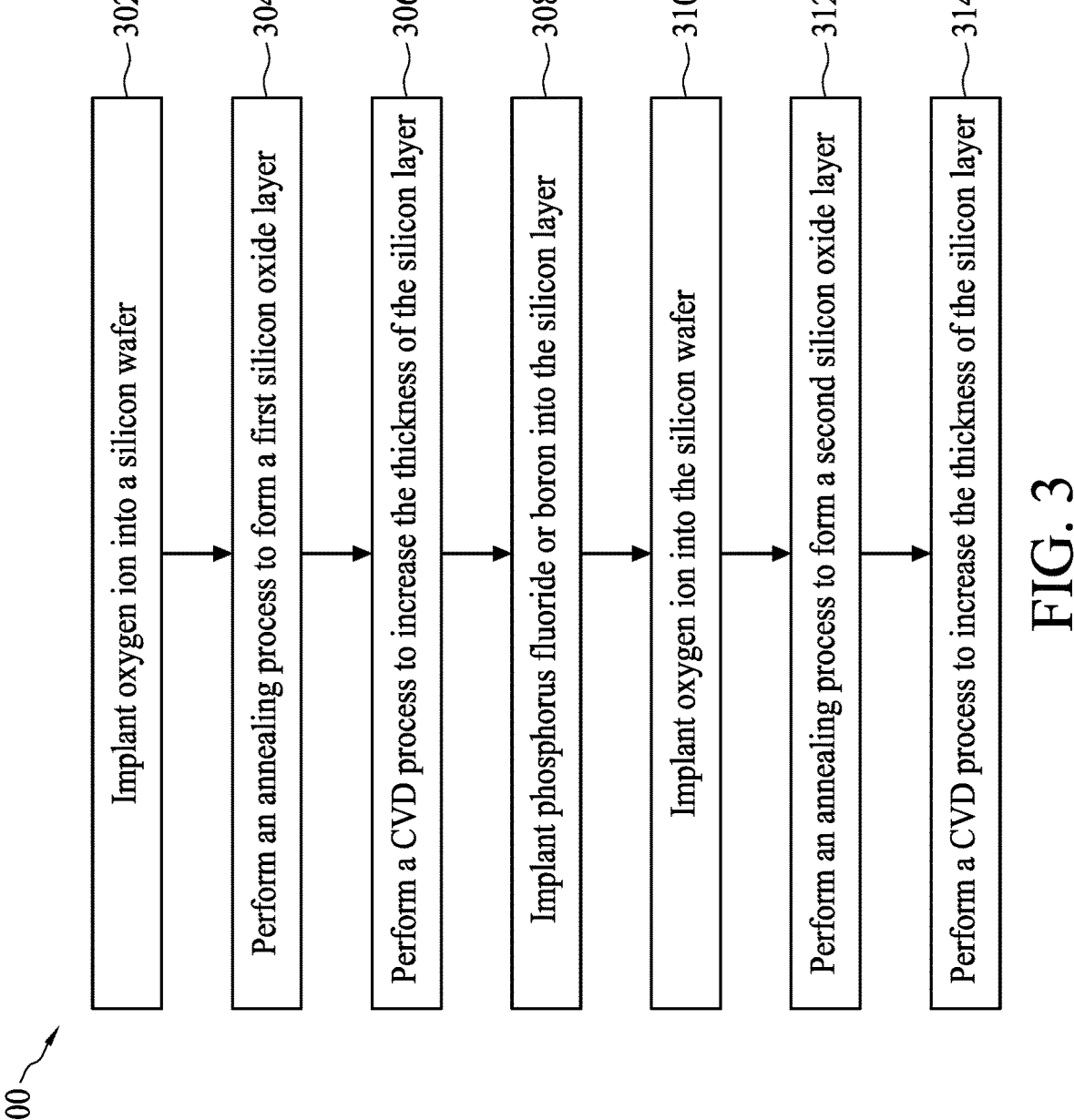

300

302 — Implant oxygen ion into a silicon wafer

304 — Perform an annealing process to form a first silicon oxide layer

306 — Perform a CVD process to increase the thickness of the silicon layer

308 — Implant phosphorus fluoride or boron into the silicon layer

310 — Implant oxygen ion into the silicon wafer

312 — Perform an annealing process to form a second silicon oxide layer

314 — Perform a CVD process to increase the thickness of the silicon layer

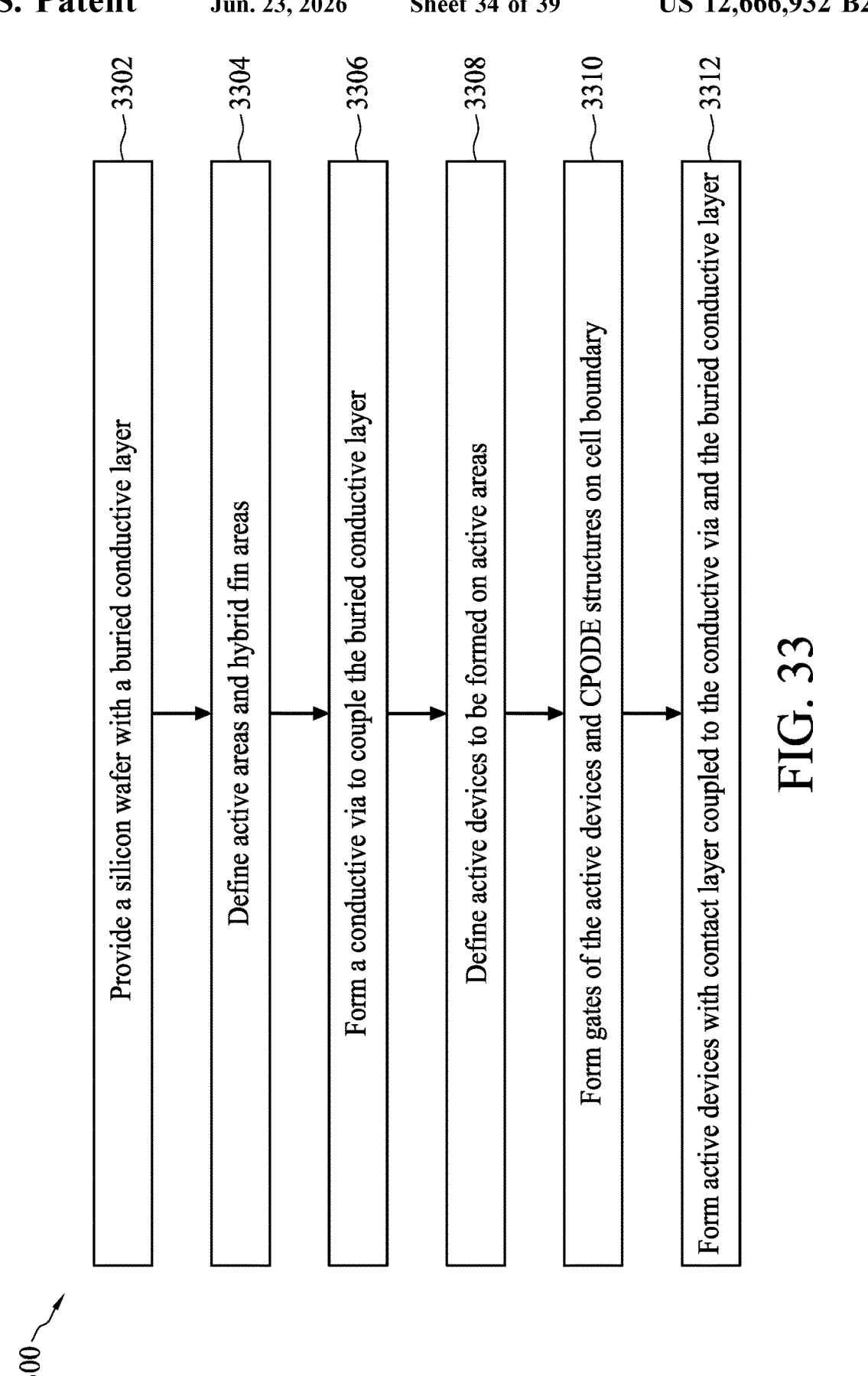

3302 Provide a silicon wafer with a buried conductive layer

3304 Define active areas and hybrid fin areas

3306 Form a conductive via to couple the buried conductive layer

3308 Define active devices to be formed on active areas

3310 Form gates of the active devices and CPODE structures on cell boundary

3312 Form active devices with contact layer coupled to the conductive via and the buried conductive layer

METHOD OF FORMING SEMICONDUCTOR DEVICE

PRIORITY DATA

This patent is a divisional application of U.S. patent application Ser. No. 16/509,433 filed on Jul. 11, 2019, entitled of "SEMICONDUCTOR DEVICE AND METHOD OF FORMING THE SEMICONDUCTOR DEVICE", the entire disclosure of which is hereby incorporated by reference.

BACKGROUND

Semiconductor devices are used in a variety of electronic applications, such as, for example, personal computers, cell phones, digital cameras, and other electronic equipment. As the semiconductor industry has progressed into nanometer technology process nodes in pursuit of higher device density, higher performance, and lower costs, challenges from both fabrication and design issues have resulted in the development of three-dimensional designs. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is a flowchart illustrating a method of forming the wafer of FIG. 2 in accordance with some embodiments.

FIG. 33 is a flowchart illustrating a method of forming a semiconductor device in accordance with some embodiments.

DETAILED DESCRIPTION

Figure 1:
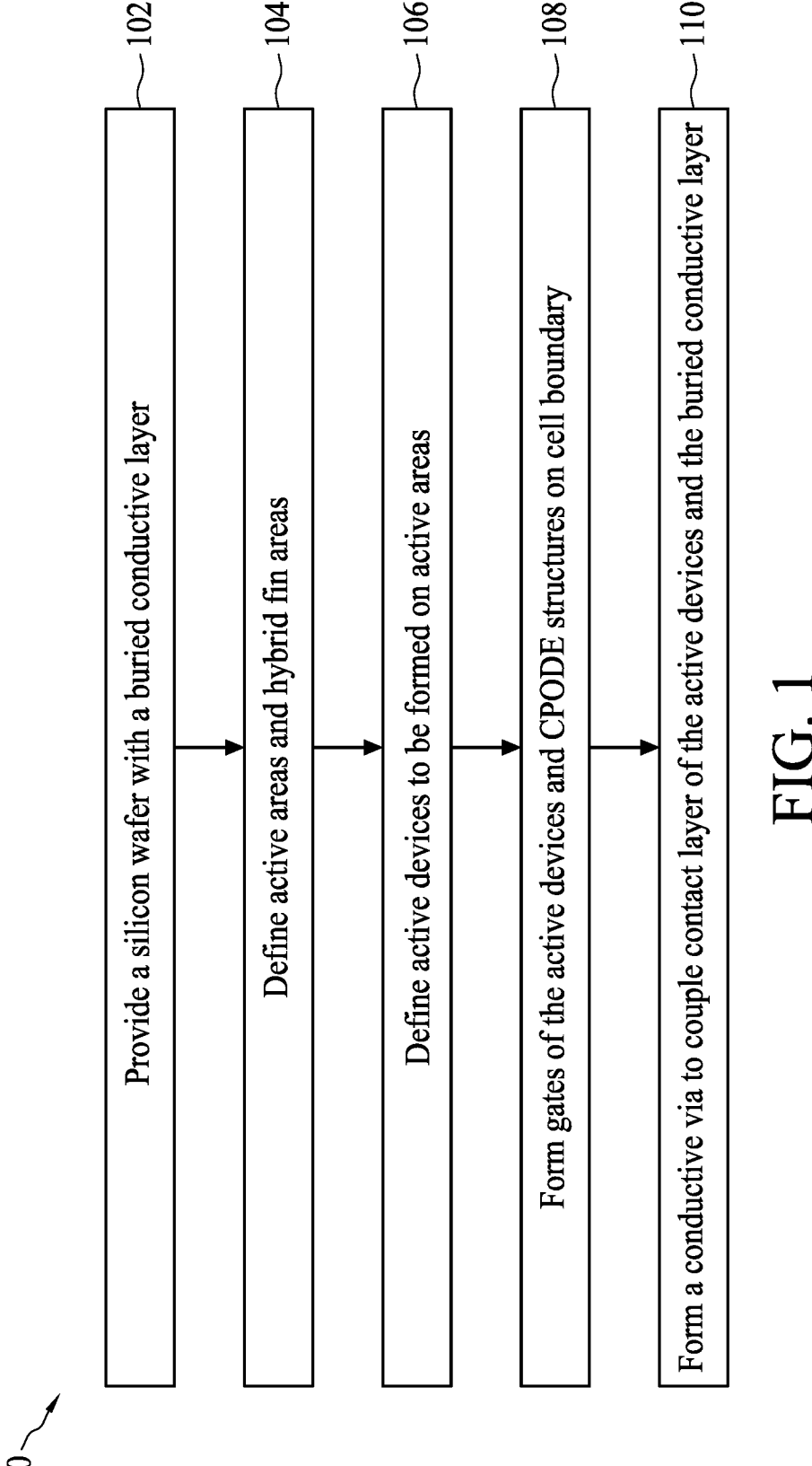
FIG. 1 is a flowchart illustrating a method of forming a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1 is a flowchart illustrating a method 100 of forming a semiconductor device in accordance with some embodiments. The semiconductor device may be a planar field-effect transistor (FET), a fin-like field-effect transistor (Fin-FET), a gate-all-around field-effect transistor (GAA FET), a complementary field-effect transistor (CFET), or a static random access memory (SRAM) comprised of the above mentioned transistors. Generally, the semiconductor device may include a gate electrode, a source region and a drain region. In the case of a FinFET device, the FinFET includes a plurality of fins and a gate electrode. Each of the fins may have a first and a second source/drain (S/D) region and a channel region located there between. The gate electrode may surround the channel regions. The method 100 comprises operations 102-110. Provided that substantially the same result is achieved, the operations of the flowchart shown in FIG. 1 may not follow the same order and may not be contiguous. In some embodiments, other intermediate operations may be included.

Figure 2:
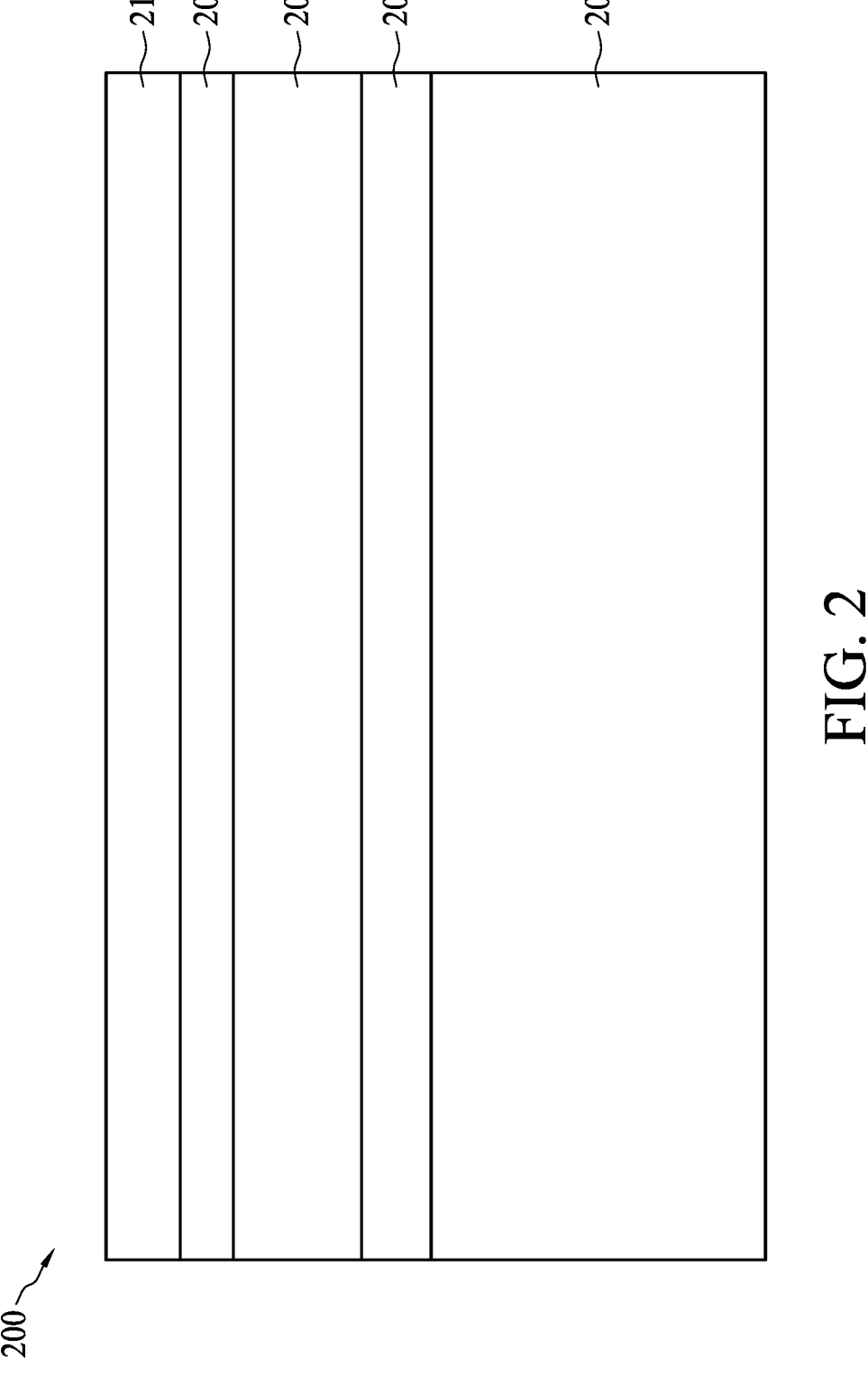
FIG. 2 is a diagram illustrating a wafer in accordance with some embodiments.

In operation 102 and FIG. 2, a silicon wafer with a buried conductive layer is provided. FIG. 2 is a diagram illustrating a wafer 200 in accordance with some embodiments. According to some embodiments, the wafer is a base wafer comprising a silicon substrate 202, a first insulator layer 204, a conductive layer 206, a second insulator layer 208, and a silicon layer 210. The insulator layers 204 and 208 may be silicon oxide layers. The insulator layer 204 is disposed on the silicon substrate 202, the conductive layer 206 is disposed on the upper surface of the insulator layer 204, the insulator layer 208 is disposed on the upper surface of the conductive layer 206, and the silicon layer 210 is disposed on the upper surface of the insulator layer 208. According to some embodiments, the conductive layer 206 is buried inside the wafer 200. The conductive layer 206 may be an ion-implanted silicon layer. The conductive layer 206 may be a non-metallic conductive layer. The conductive layer 206 may be an n-type doping layer (N+) or a p-type doping layer (P+). For example, when the conductive layer 206 is n-type doping layer, the layer may be implanted with phosphorus fluoride ($PF_2$). When the conductive layer 206 is p-type doping layer, the layer may be implanted with boron (B).

FIG. 3 is a flowchart illustrating a method 300 of forming the wafer 200 in accordance with some embodiments. The method 300 may comprise a twice SIMOX (Separation by Implantation of Oxygen) process to form a base wafer for forming the above mentioned semiconductor device. The method 300 comprises operations 302-314. Provided that substantially the same result is achieved, the operations of the flowchart shown in FIG. 3 may not follow the same order and may not be contiguous. In some embodiments, other intermediate operations may be included.

Figure 4:
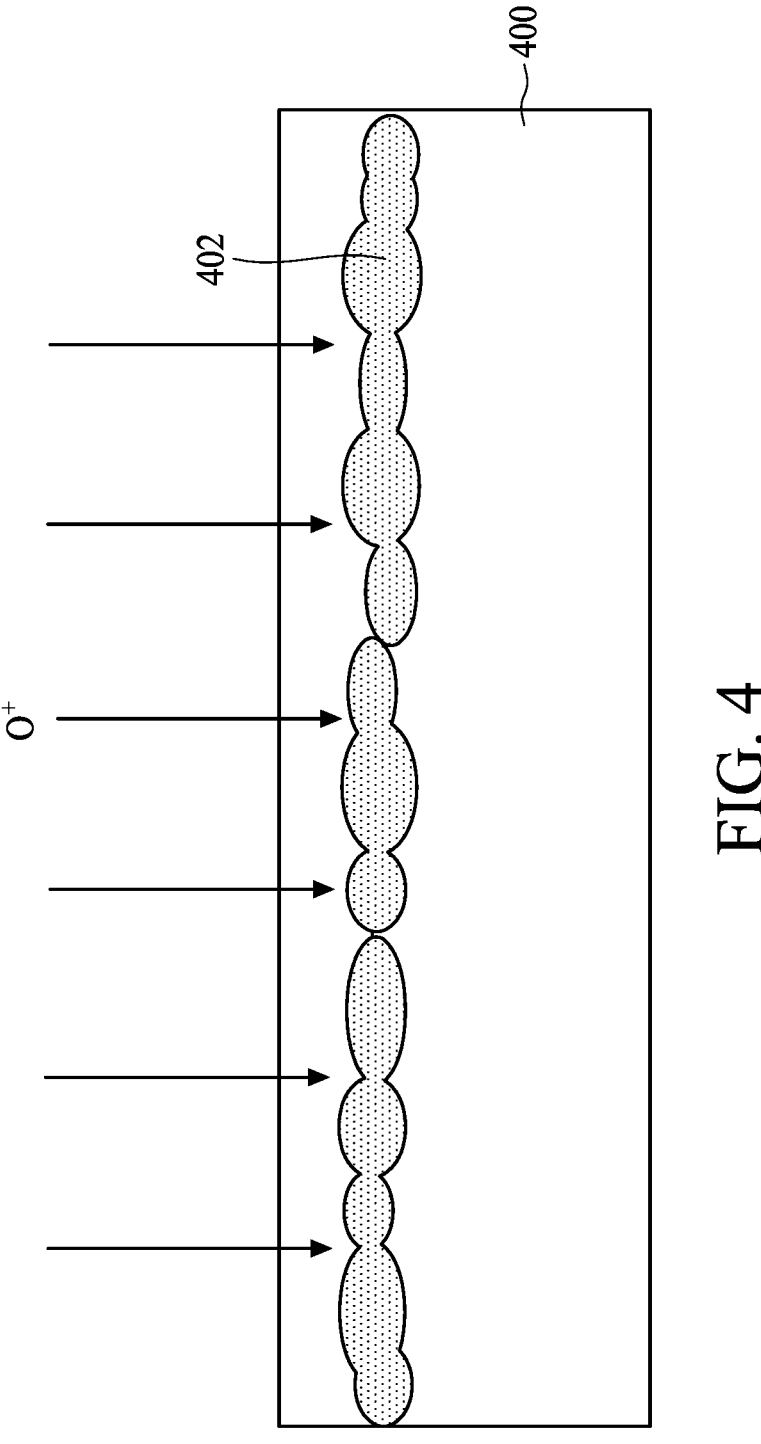
FIG. 4 is a diagram illustrating silicon oxide particles formed in a silicon wafer in accordance with some embodiments.

In operation 302 and FIG. 4, an implantation process is performed upon a silicon wafer 400 for implanting oxygen ion ($O^+$) into the silicon wafer 400. In operation 302, the silicon oxide particles 402 are implanted into the silicon wafer 400.

Figure 5:
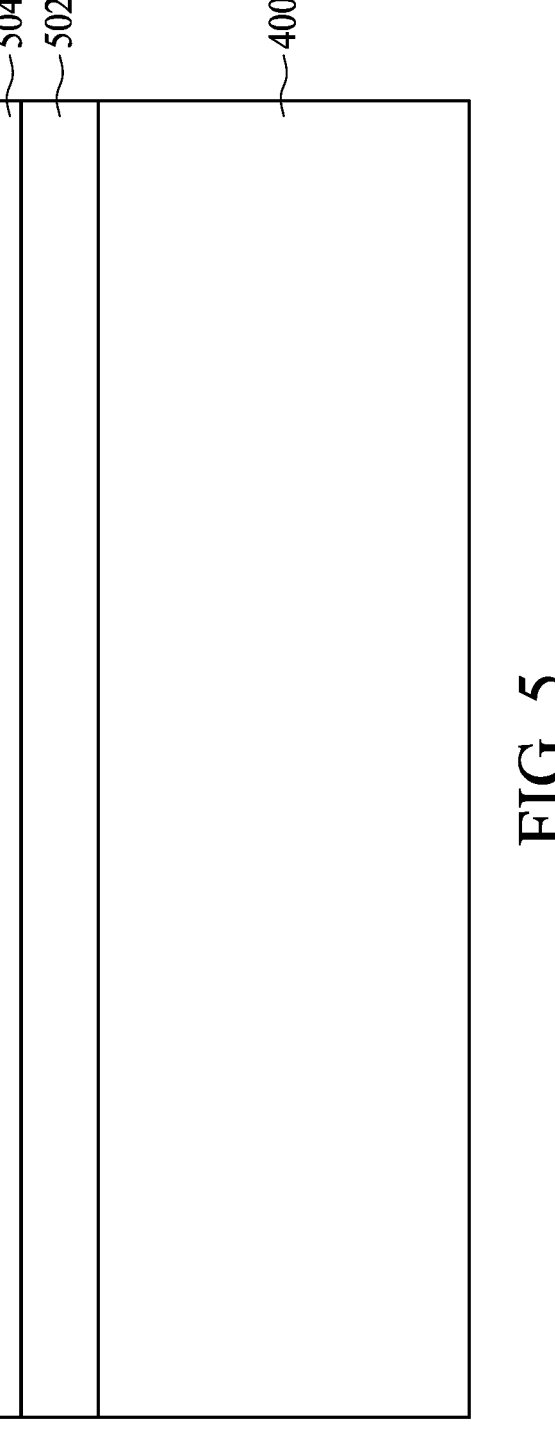
FIG. 5 is a diagram illustrating a silicon oxide layer formed in the silicon wafer in accordance with some embodiments.

In operation 304 and FIG. 5, an annealing process is performed upon the silicon wafer 400 to form a silicon oxide layer 502 in the silicon wafer 400. A relatively thin silicon layer 504 is formed above the silicon oxide layer 502 when the silicon oxide layer 502 is formed inside the silicon wafer 400.

Figure 6:
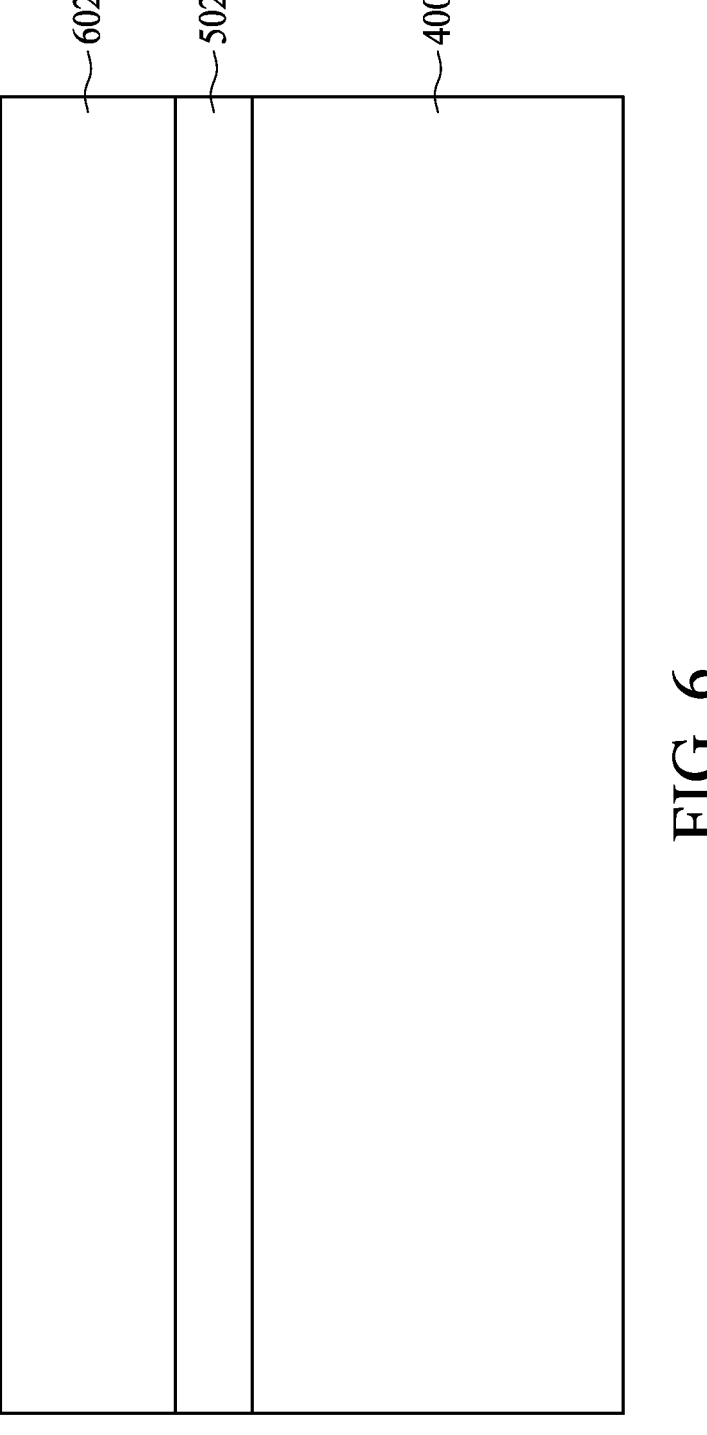
FIG. 6 is a diagram illustrating a relatively thick silicon layer formed on the silicon wafer in accordance with some embodiments.

In operation 306 and FIG. 6, a chemical vapor deposition (CVD) process is performed upon the silicon wafer 400 to form a relatively thick silicon layer 602 on the silicon oxide layer 502.

Figure 7:
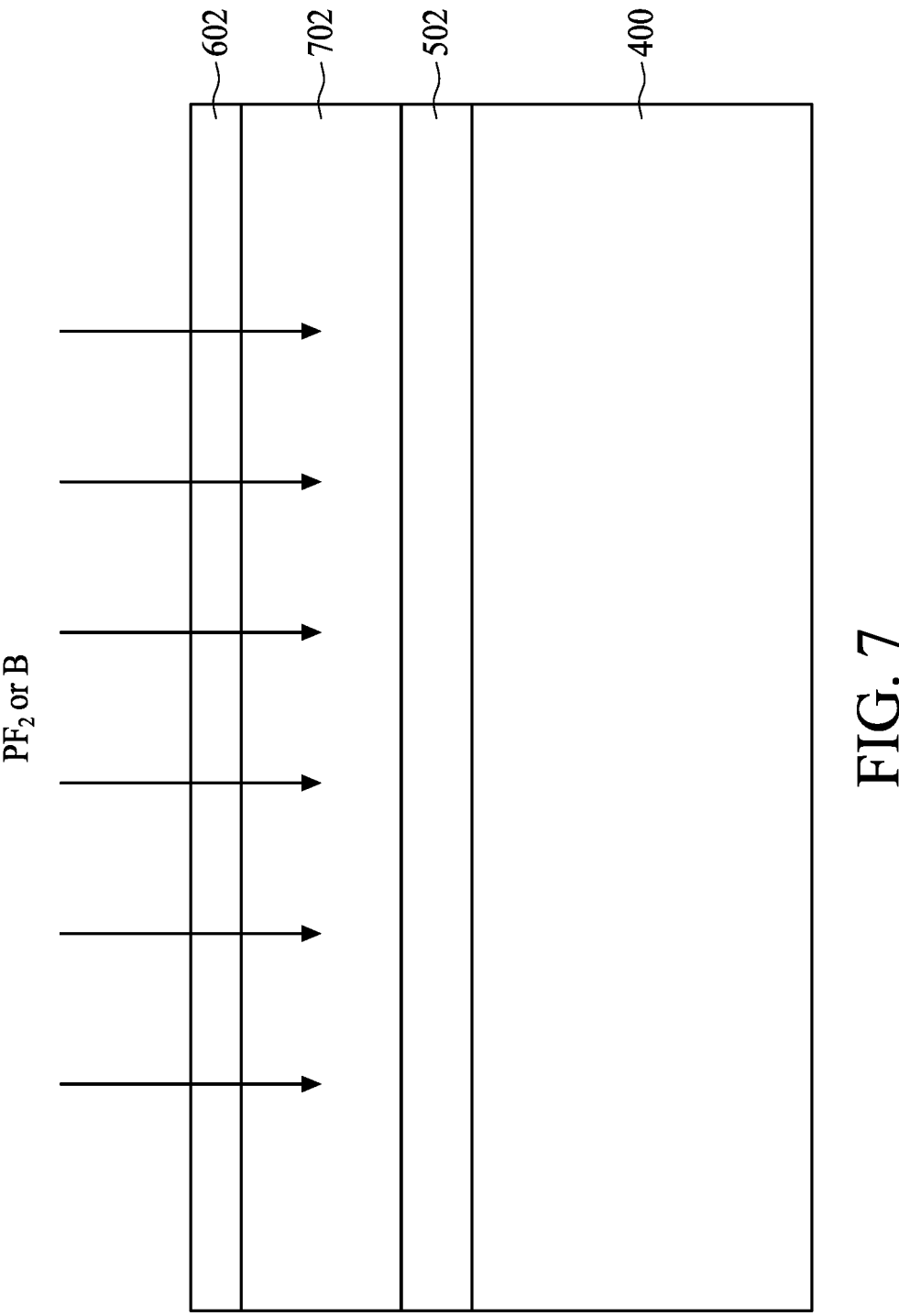
FIG. 7 is a diagram illustrating a conductive layer formed in the silicon wafer in accordance with some embodiments.

In operation 308 and FIG. 7, an implantation process is performed upon the silicon wafer 400 for implanting phosphorus fluoride ($PF_2$) or boron (B) into the silicon layer 602. If an n-type doping layer (N+) is to be formed in the silicon layer 602, then phosphorus fluoride, for example, is implanted into the silicon layer 602. If a p-type doping layer (P+) is to be formed in the silicon layer 602, then boron, for example, is implanted into the silicon layer 602. As a result, a conductive layer (N+ or P+) 702 may be formed inside the silicon layer 602. When the conductive layer 702 is formed inside the silicon layer 602, the thickness of the silicon layer 602 may be reduced.

Figure 8:
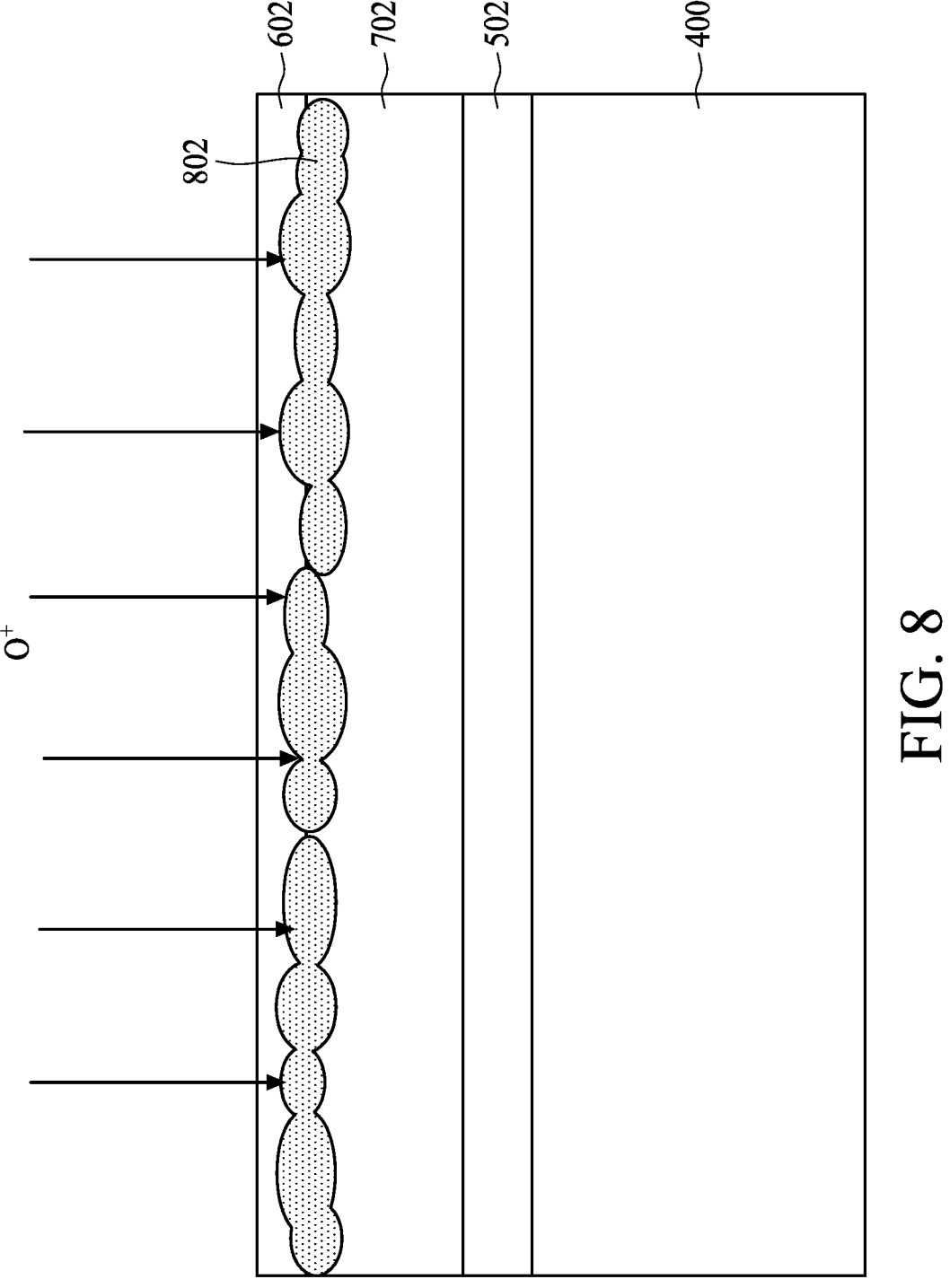
FIG. 8 is a diagram illustrating silicon oxide particles formed in a silicon wafer in accordance with some embodiments.

In operation 310 and FIG. 8, an implantation process is performed upon a silicon wafer 400 for implanting oxygen ion ($O^+$) into the silicon layer 602. The silicon oxide particles 802 may be formed on the interface between the silicon layer 602 and the conductive layer 702.

Figure 9:
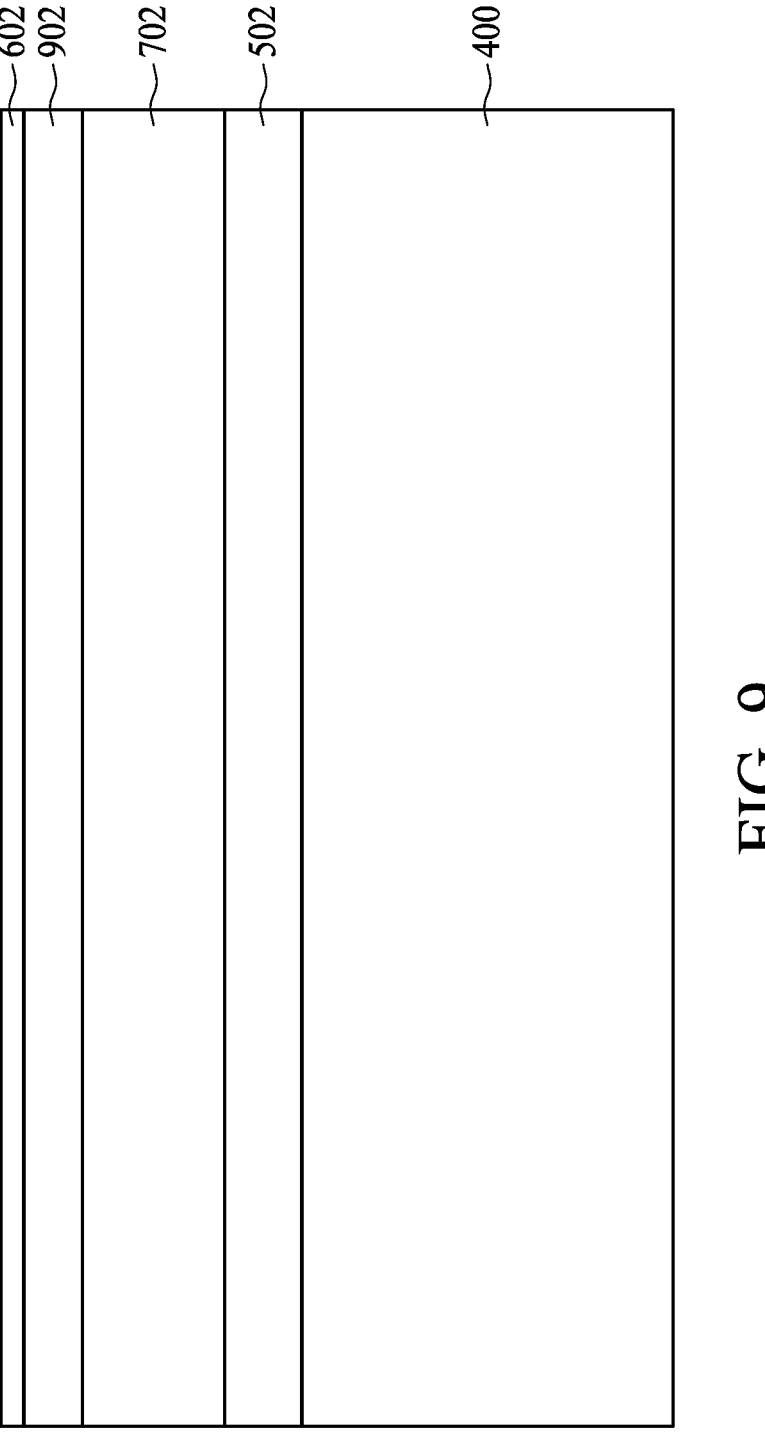
FIG. 9 is a diagram illustrating a silicon oxide layer formed in the silicon wafer in accordance with some embodiments.

In operation 312 and FIG. 9, an annealing process is performed upon the silicon wafer 400 to form a silicon oxide layer 902 in the silicon layer 602 and/or a portion of the conductive layer 702. When the silicon oxide layer 902 is formed inside the silicon layer 602, the thickness of the silicon oxide layer 602 may further be reduced.

Figure 10:
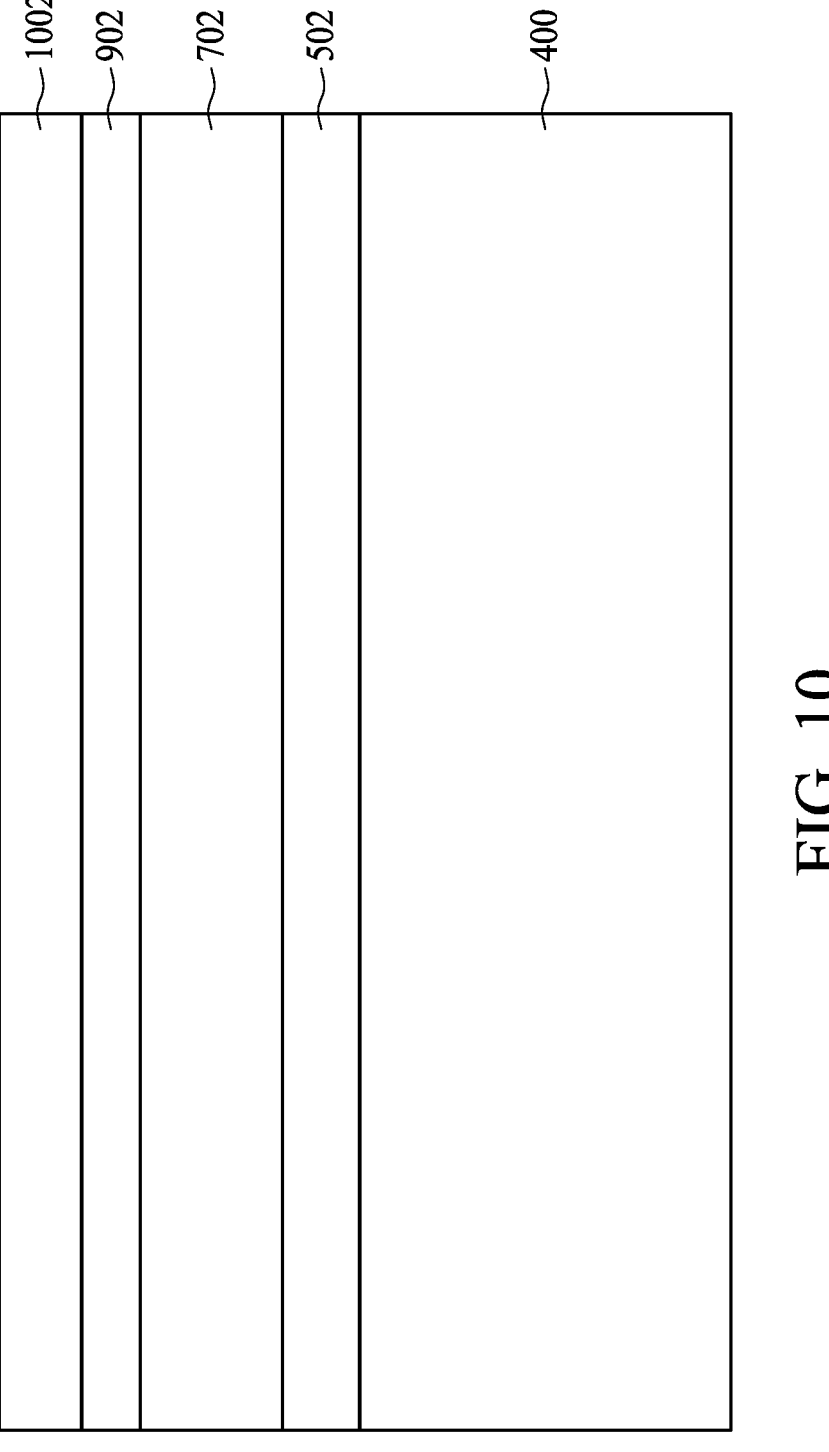
FIG. 10 is a diagram illustrating a relatively thick silicon layer formed on the silicon wafer in accordance with some embodiments.

In operation 314 and FIG. 10, a CVD process is performed upon the silicon wafer 400 to increase the thickness of the silicon layer 602 on the silicon oxide layer 902 to form a relatively thick silicon layer 1002. In operation 314, a chemical-mechanical planarization process may further be applied to smooth the top surface of the silicon layer 1002 after the CVD process. In FIG. 10, the silicon layer 1002, the oxide layer 902, the conductive layer 702, the oxide layer 502, and the silicon wafer 400 are similar to the silicon substrate 202, the insulator layer 204, the conductive layer 206, the insulator layer 208, and the silicon layer 210 of FIG. 2 respectively.

After the operations 302-314, a base wafer (i.e. 200) with a buried conductive layer (i.e. 702) is formed. The buried conductive layer is disposed between two insulator layers (i.e. the silicon oxide layers 502 and 902) in the silicon wafer. According to some embodiments, the thickness of the silicon oxide layers 502 may greater than the thickness of the silicon oxide layers 902.

Figure 11:
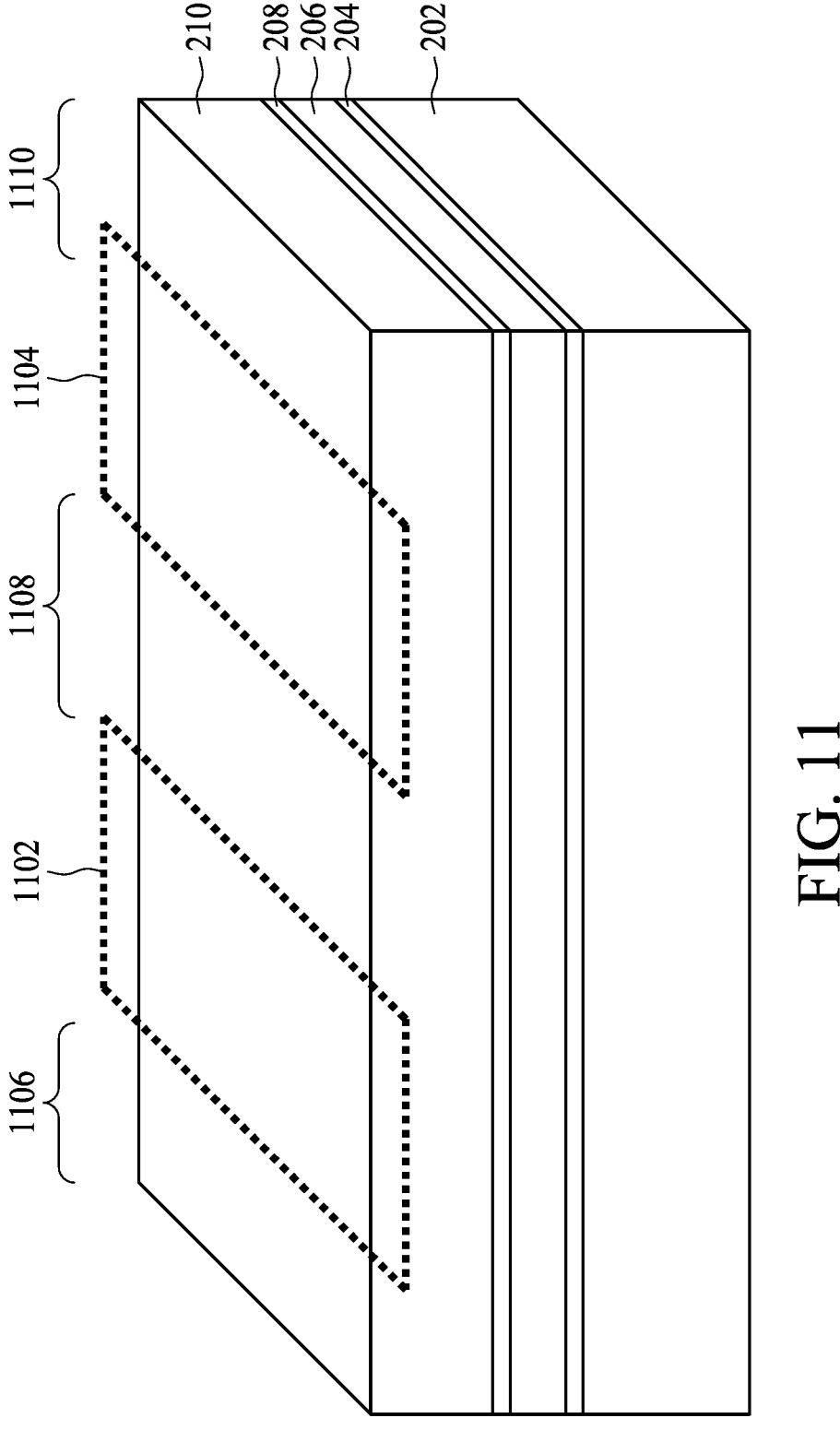
FIG. 11 is a diagram illustrating active areas and hybrid fin areas on the silicon layer in accordance with some embodiments.
Figure 12:
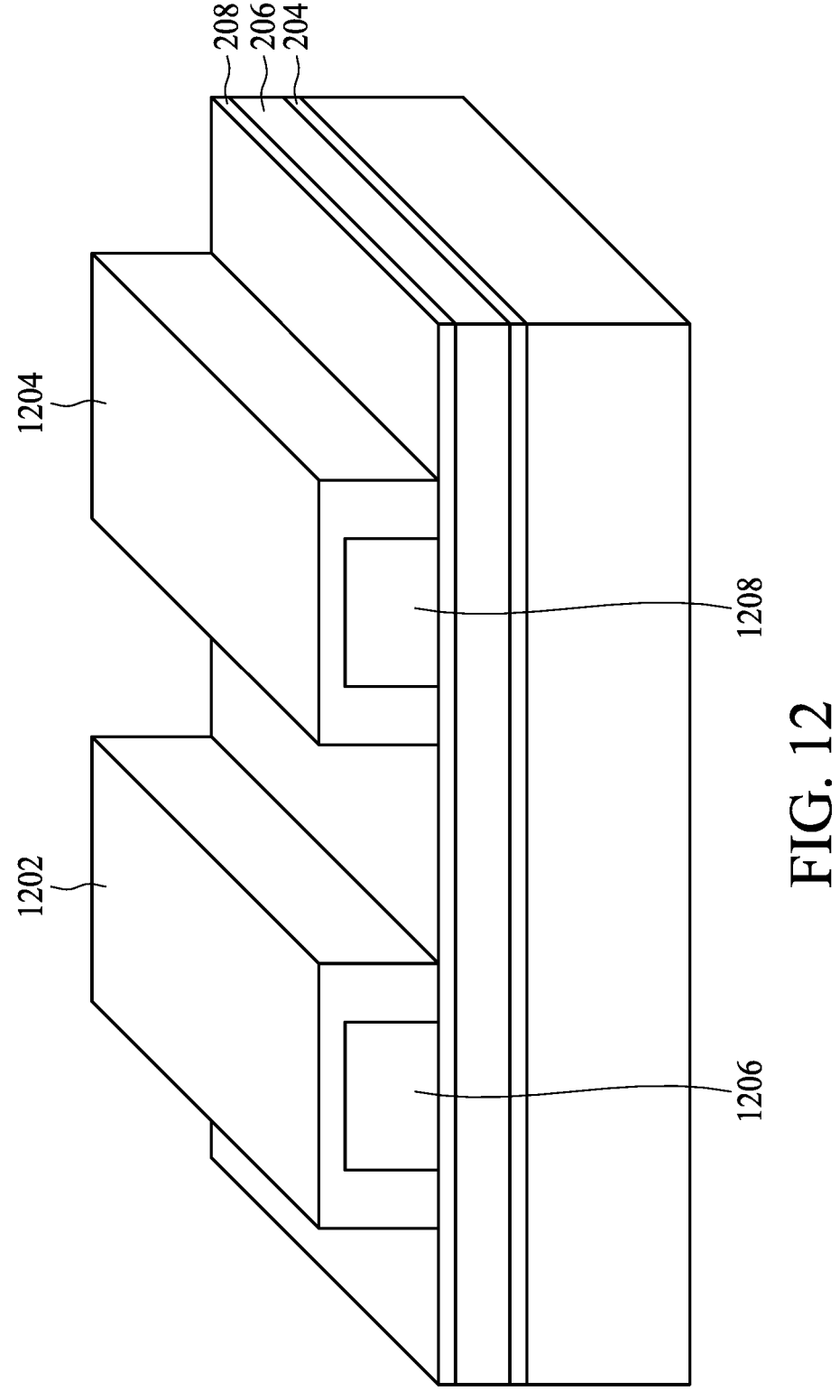
FIG. 12 is a diagram illustrating spacers and silicon portions formed on an insulator layer in accordance with some embodiments.

Please refer to FIG. 1 again, in operation 104 and FIG. 11, active areas (or oxide diffusion (OD) area) and hybrid fin areas are defined on the wafer 200. FIG. 11 is a diagram illustrating the active areas 1102 and 1104 and hybrid fin areas 1106, 1108, and 1110 on the top surface of the silicon layer 210 in accordance with some embodiments. Moreover, in operation 104, a first etching process is performed to etch the portion of silicon corresponding to the hybrid fin regions 1106, 1108, and 1110 on the silicon layer 210 for exposing the top surface of the insulator layer 208. Then, in FIG. 12, spacers 1202 and 1204 are formed to cover the silicon corresponding to the active areas 1102 and 1104 of the silicon layer 210 respectively. FIG. 12 is a diagram illustrating the spacers 1202 and 1204 and silicon portions 1206 and 1208 on the top surface of the insulator layer 208 in accordance with some embodiments.

Figure 13:
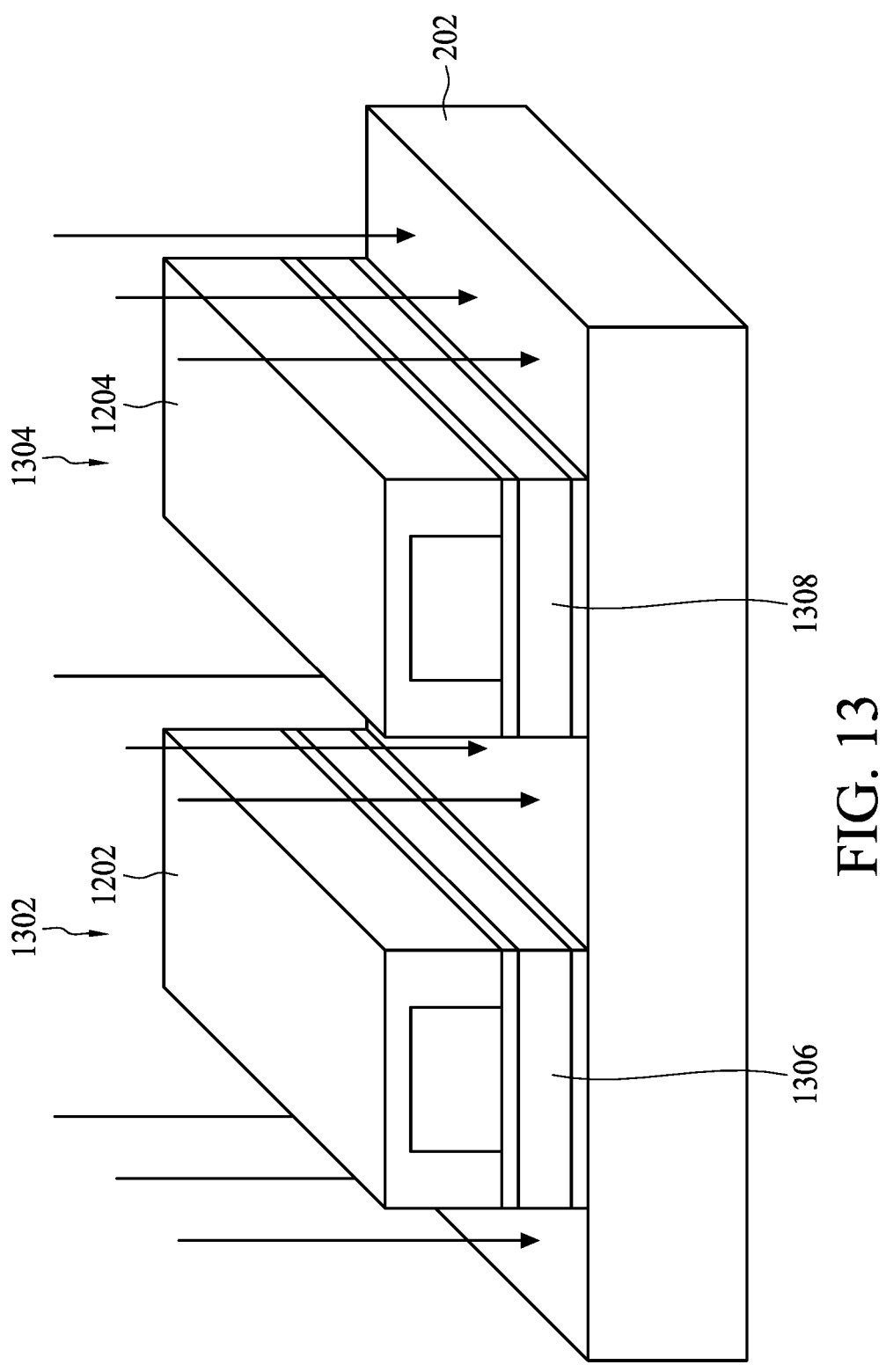
FIG. 13 is a diagram illustrating active regions formed on a silicon substrate in accordance with some embodiments.

In addition, in operation 104 and FIG. 13, a second etching process is performed to etch the portions of the insulator layer 208, the conductive layer 206, and the insulator layer 204 without covered by the spacers 1202 and 1204 to expose the top surface of the silicon substrate 202. Accordingly, a first active region 1302 and a second active region 1304 corresponding to a first active device and a second active device are formed on the silicon substrate 202 respectively. FIG. 13 is a diagram illustrating the active regions 1302 and 1304 formed on the silicon substrate 202 in accordance with some embodiments. After the second etching process, a first conductive layer 1306 and a second conductive layer 1308 corresponding to the first active region 1302 and the second active region 1304 are physically separated with each other.

Figure 14:
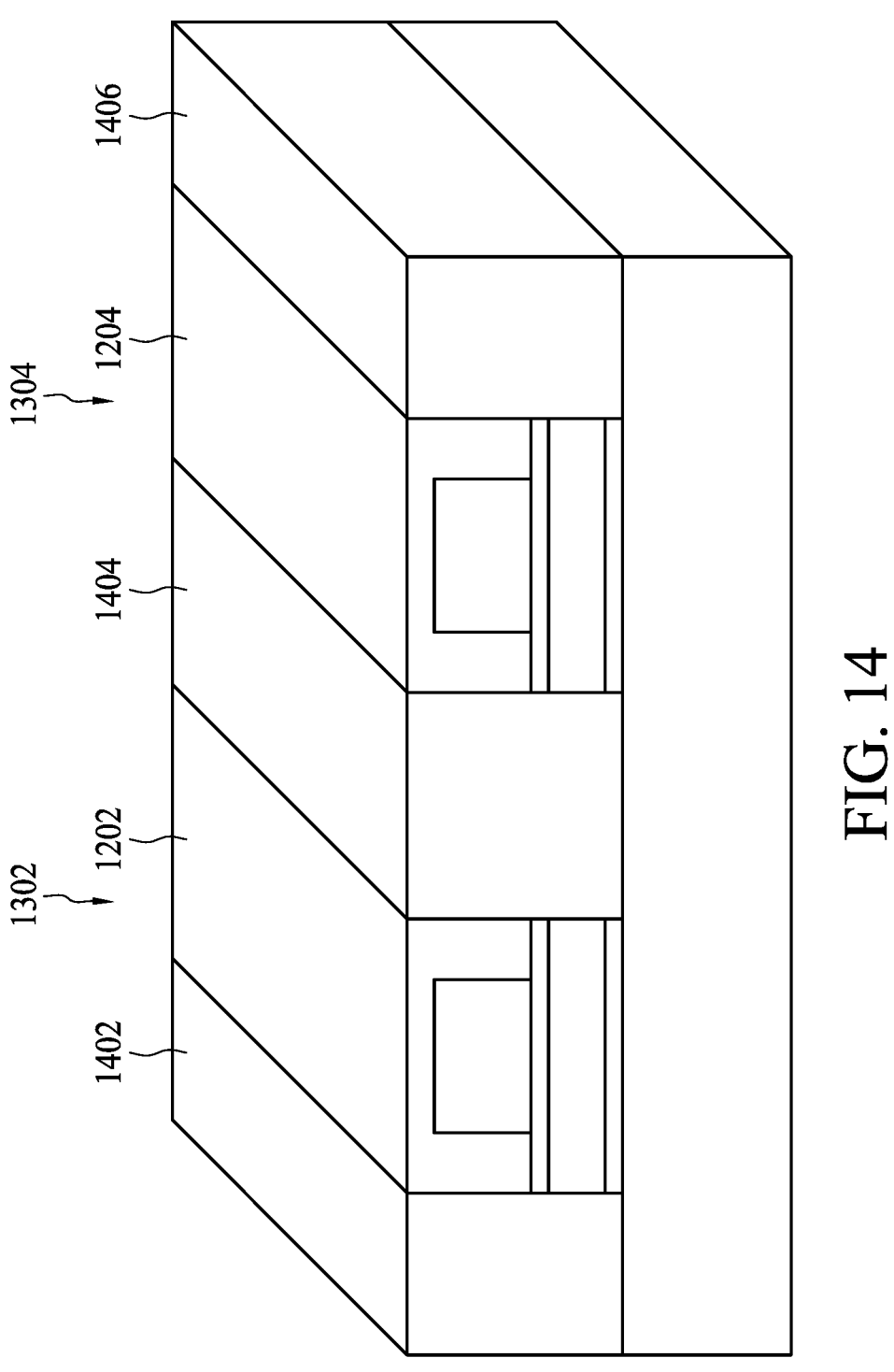
FIG. 14 is a diagram illustrating a first active region and a second active region in accordance with some embodiments.

Moreover, in operation 104 and FIG. 14, a deposition process is performed upon the opposite sides of the active region to form a plurality of hybrid fins 1402, 1404, and 1406 for isolating the first active region 1302 and the second active region 1304. FIG. 14 is a diagram illustrating the isolated first active region 1302 and the second active region 1304 in accordance with some embodiments. The hybrid fins 1402, 1404, and 1406 may be insulator fins. For example, the hybrid fin 1402 is formed in the left sides of the remaining portions of the insulator layer 208, the conductive layer 1306, and the insulator layer 204, and the hybrid fin 1404 is formed in the right sides of the remaining portions of the insulator layer 208, the conductive layer 1306, and the insulator layer 204. According to some embodiments, the deposition process may fill oxide dummy to the top surface of the silicon substrate 202 for isolating the first active region 1302 and the second active region 1304. Moreover, the deposition process may be atomic layer deposition (ALD), chemical vapor deposition (CVD), physical vapor deposition (PVD), etc.

In operation 106, the first active region 1302 and the second active region 1304 are arranged to form a first specific active device and a second specific active device respectively. For example, the specific active device may be an N/P-type planar FET, an N/P-type FinFET, an N/P-type GAA FET, or a CFET. For example, FIGS. 15-21 are diagrams illustrating the forming of FinFETs on the silicon substrate 202 in accordance with some embodiments. FIGS. 24-30 are diagrams illustrating the processes of forming CFETs on the silicon substrate 202 in accordance with some embodiments.

Figure 15:
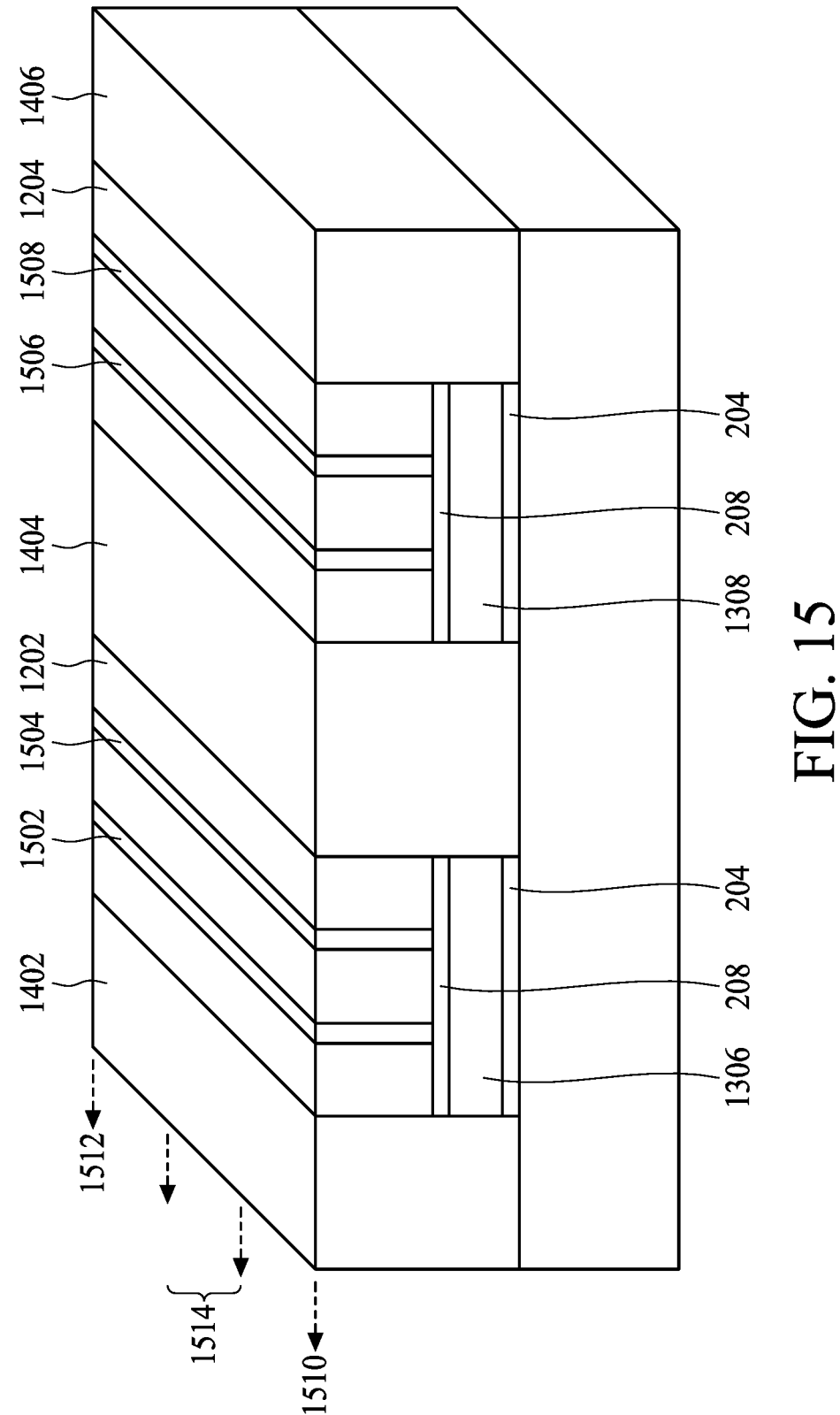
FIG. 15 is a diagram illustrating semiconductor fin structures formed in the first active region and the second active region in accordance with some embodiments.

In operation 106 and FIG. 15, at least one semiconductor fin structure is formed in the first active region 1302, and at least one semiconductor fin structure is formed in the second active region 1304. For example, two fins 1502 and 1504 are formed in the first active region 1302, and two fins 1506 and 1508 are formed in the second active region 1304. The fins 1502, 1504, 1506 and 1508 are extended from a cell boundary 1510 to the other cell boundary 1512 of the semiconductor device. The FinFETs may be formed in the active region between the boundaries 1510 and 1512, and polysilicon structures may be formed on the boundaries 1510 and 1512 to cut off the conductive layers 1306 and 1308. According to some embodiments, the polysilicon structures may be a structure connected poly on gate oxide and diffusion edge (CPODE). Moreover, an NMOS device, e.g. an N-type FinFET, is to be formed in the first active region 1302, and a PMOS device, e.g. a P-type FinFET, is to be formed in the second active region 1304. In addition, a chemical-mechanical planarization (CMP) process may further be applied to smooth the top surfaces of the fins 1502, 1504, 1506, and 1508, the spacers 1202 and 1204, and the hybrid fins 1402, 1404, and 1406. The detailed description of forming the fins 1502, 1504, 1506 and 1508 is omitted here for brevity.

Figure 16:
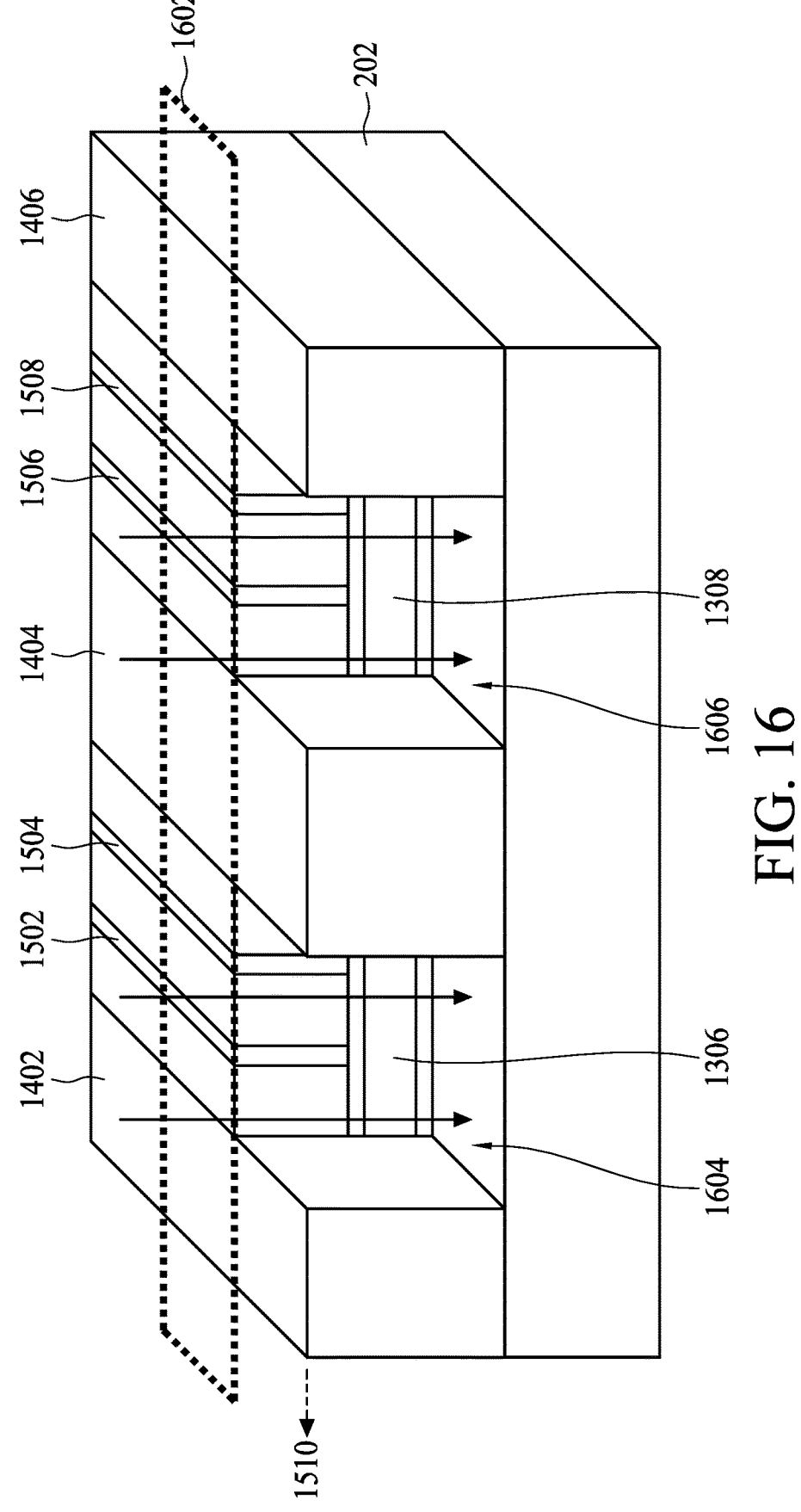
FIG. 16 is a diagram illustrating a first trench and a second trench formed on the boundary of the semiconductor structure in accordance with some embodiments.

According to some embodiments, for the boundary 1510 as well as 1512 of the semiconductor structure of FIG. 15, an etching process is performed upon the boundary 1510 of the semiconductor structure to cut off the fins 1502, 1504, 1506, and 1508, and the conductive layers 1306 and 1308 as shown in FIG. 16. According to some embodiments, a boundary polysilicon layer is to be disposed beside the boundary 1510 of the semiconductor structure. Before the etching process, the location (i.e. 1602) of the boundary polysilicon layer is determined. Then, during the etching process, the materials (i.e. the fins 1502, 1504, 1506, and 1508, the spacers 1202 and 1204, the insulator layers 208 and 204, and the conductive layers 1306 and 1308) along the direction of the boundary polysilicon layer are etched until the top surface of the silicon substrate 202 is exposed. It is noted that the hybrid fins 1402, 1404, and 1406 may not be etched during the etching process. After the etching process, a first trench 1604 and a second trench 1606 are formed on the boundary 1510 of the semiconductor structure.

Figure 17:
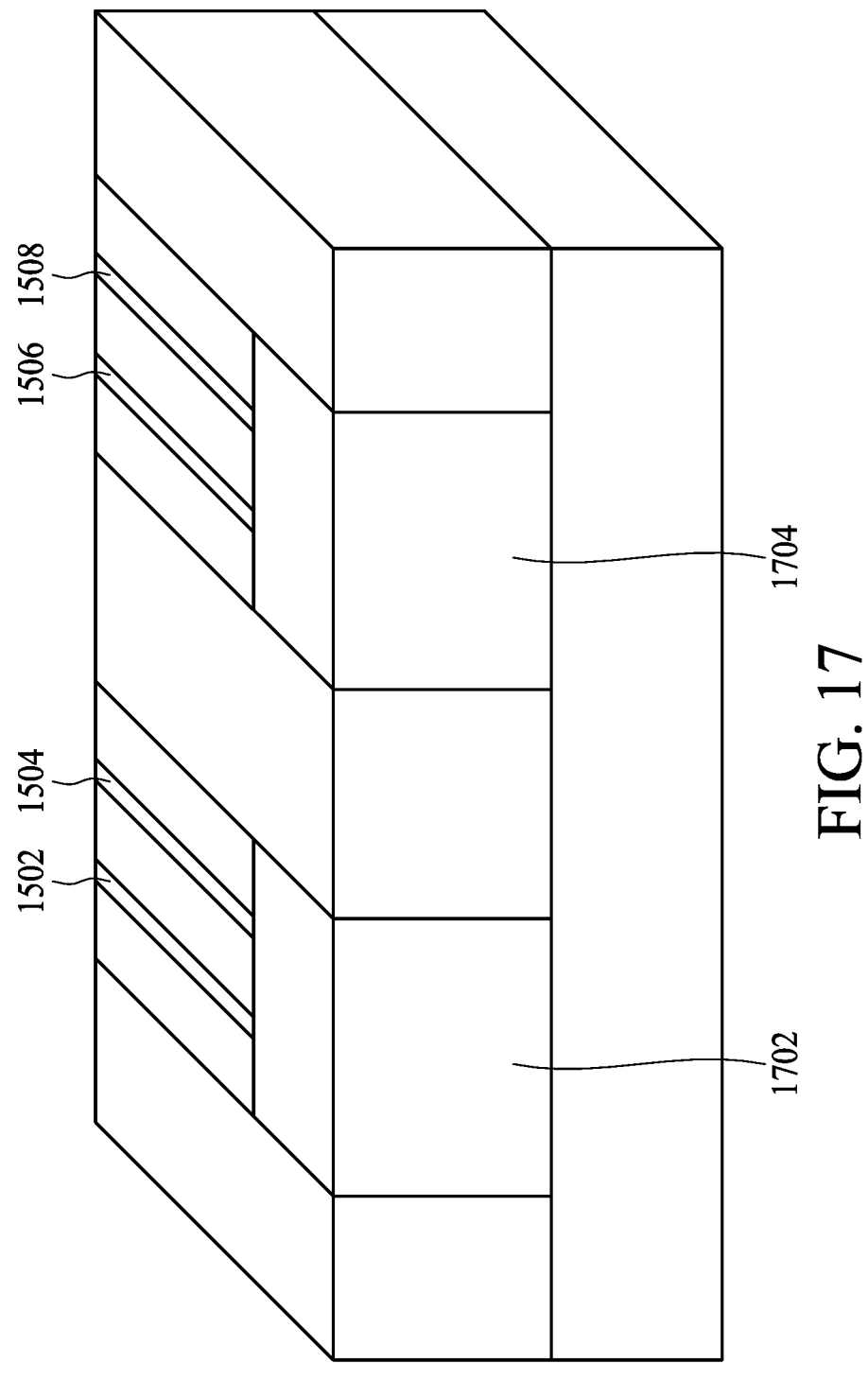
FIG. 17 is a diagram illustrating a first polysilicon layer and a second polysilicon layer formed on the boundary of the semiconductor structure in accordance with some embodiments.

In FIG. 17, a CPODE process is performed to form a first polysilicon layer 1702 and a second polysilicon layer 1704 in the first trench 1604 and the second trench 1606 for coupling the edges of the fins 1502, 1504, 1506, and 1508, the spacers 1202 and 1204, the insulator layers 208 and 204, and the conductive layers 1306 and 1308 respectively. According to some embodiments, the polysilicon layers 1702 and 1704 are arranged to isolate the fins 1502, 1504, 1506, and 1508, and the conductive layers 1306 and 1308 from the fins and the conductive layers of the adjacent circuit cell (not shown) respectively.

Figure 18:
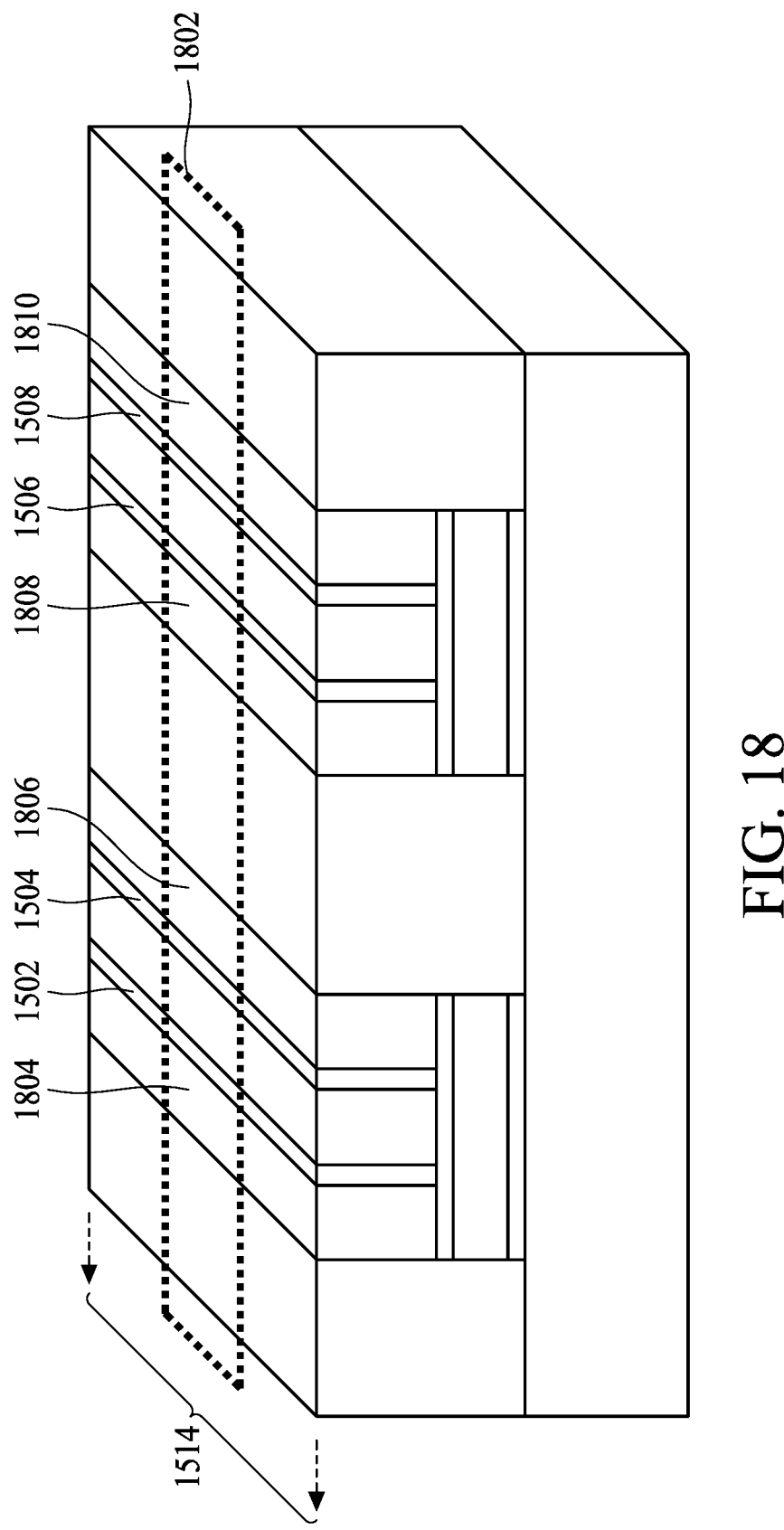
FIG. 18 is a diagram illustrating locations of the gates of active devices in accordance with some embodiments.

In operation 110, an N-type FinFET and a P-type FinFET are formed in the active device region (e.g. the portion 1514 as shown in FIG. 15) between the boundaries 1510 and 1512 of the semiconductor structure. FIG. 18 is a diagram illustrating the portion 1514 of active device regions in accordance with some embodiments. In FIG. 18, the gates of the N-type FinFET and the P-type FinFET are to be formed. The locations of the gates of the N-type FinFET and the P-type FinFET may be overlapped with the location (i.e. 1802) of a polysilicon layer to be formed across the fins 1502, 1504, 1506, and 1508.

When the locations of the gates of the N-type FinFET and the P-type FinFET are determined, a first spacer portion 1804 and a second spacer portion 1806 of the spacer 1202 and a first spacer portion 1808 and a second spacer portion 1810 of the spacer 1204 that are overlapped with the location 1802 of the polysilicon layer are etched to expose a portion of the fins 1502 and 1504 and a portion of fins 1506 and 1508 respectively. Then, a first polysilicon layer 1902 and a second polysilicon layer 1904 are formed in the etched regions for coupling the portions of the fins 1502 and 1504 and the portions of 1506 and 1508 respectively as shown in FIG. 19.

Figure 19:
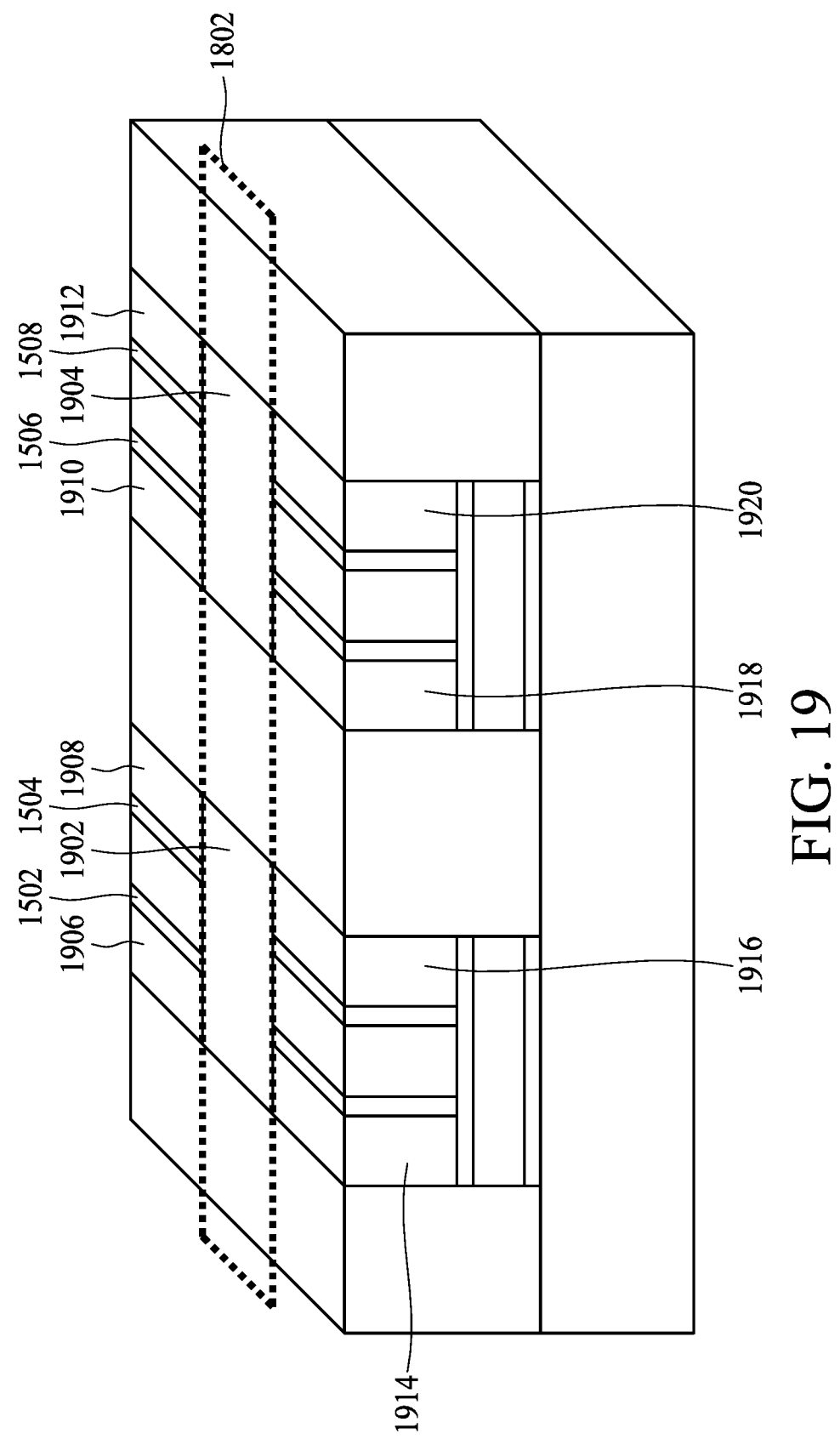
FIG. 19 is a diagram illustrating the gates of active devices in accordance with some embodiments.
Figure 20:
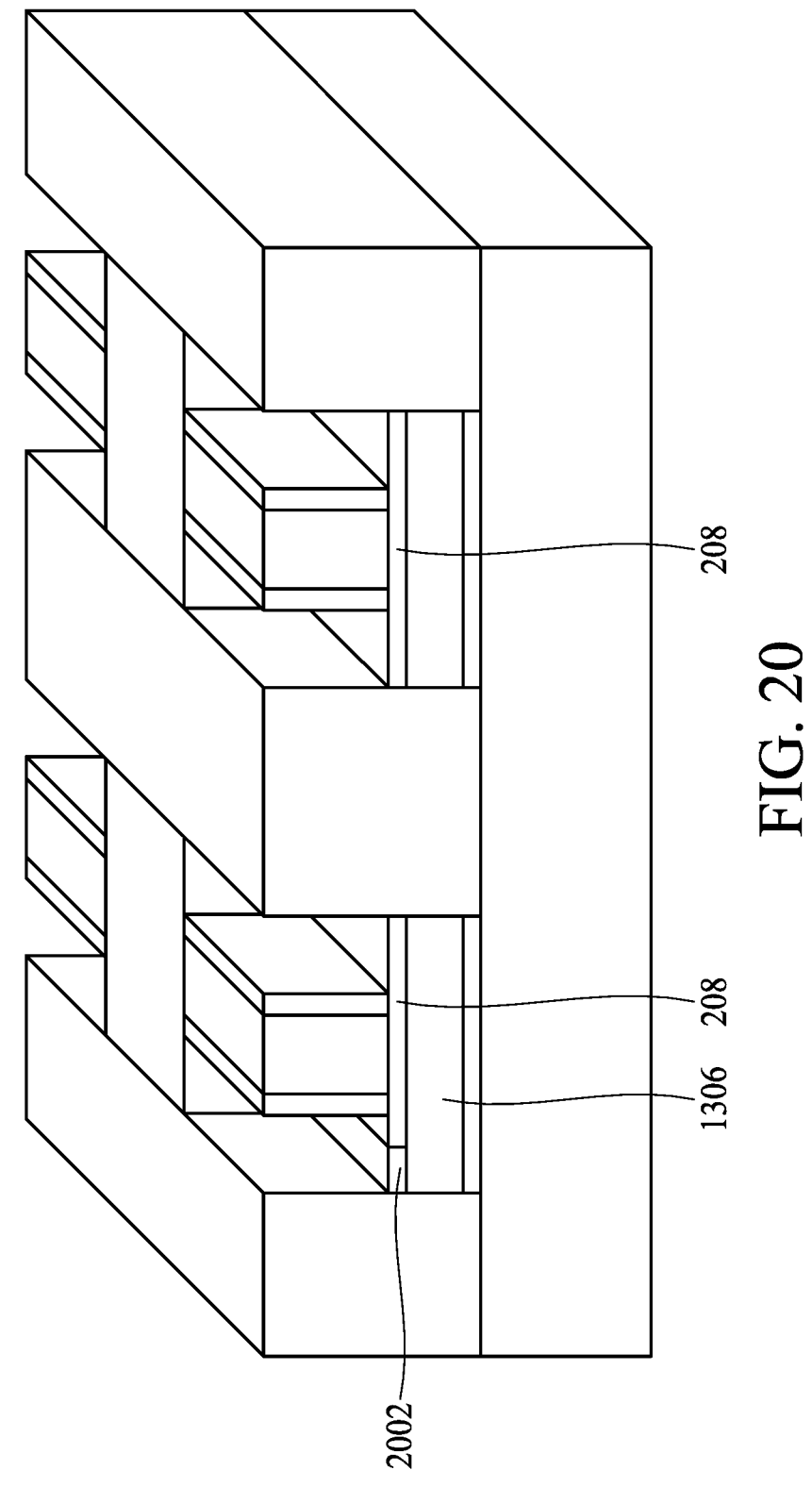
FIG. 20 is a diagram illustrating a conductive via formed on a buried conductive layer in accordance with some embodiments.

In FIG. 20, the spacer portions 1906, 1908, 1910, 1912, 1914, 1916, 1918, and 1920 of the contact regions of the N-type FinFET and the P-type FinFET in FIG. 19 are removed to expose the insulator layer 208. Moreover, a portion of insulator layer 208 in the contact region of the N-type FinFET is also removed to expose a portion of the conductive layer 1306. Then, a conductive via 2002 is formed on the exposed portion of the conductive layer 1306. The conductive via 2002 may be a metallic via. It is noted that the embodiment is not limited by the location of the conductive via 2002, the conductive via 2002 may be formed in other contact regions of the N-type FinFET and the P-type FinFET.

Figure 21A:
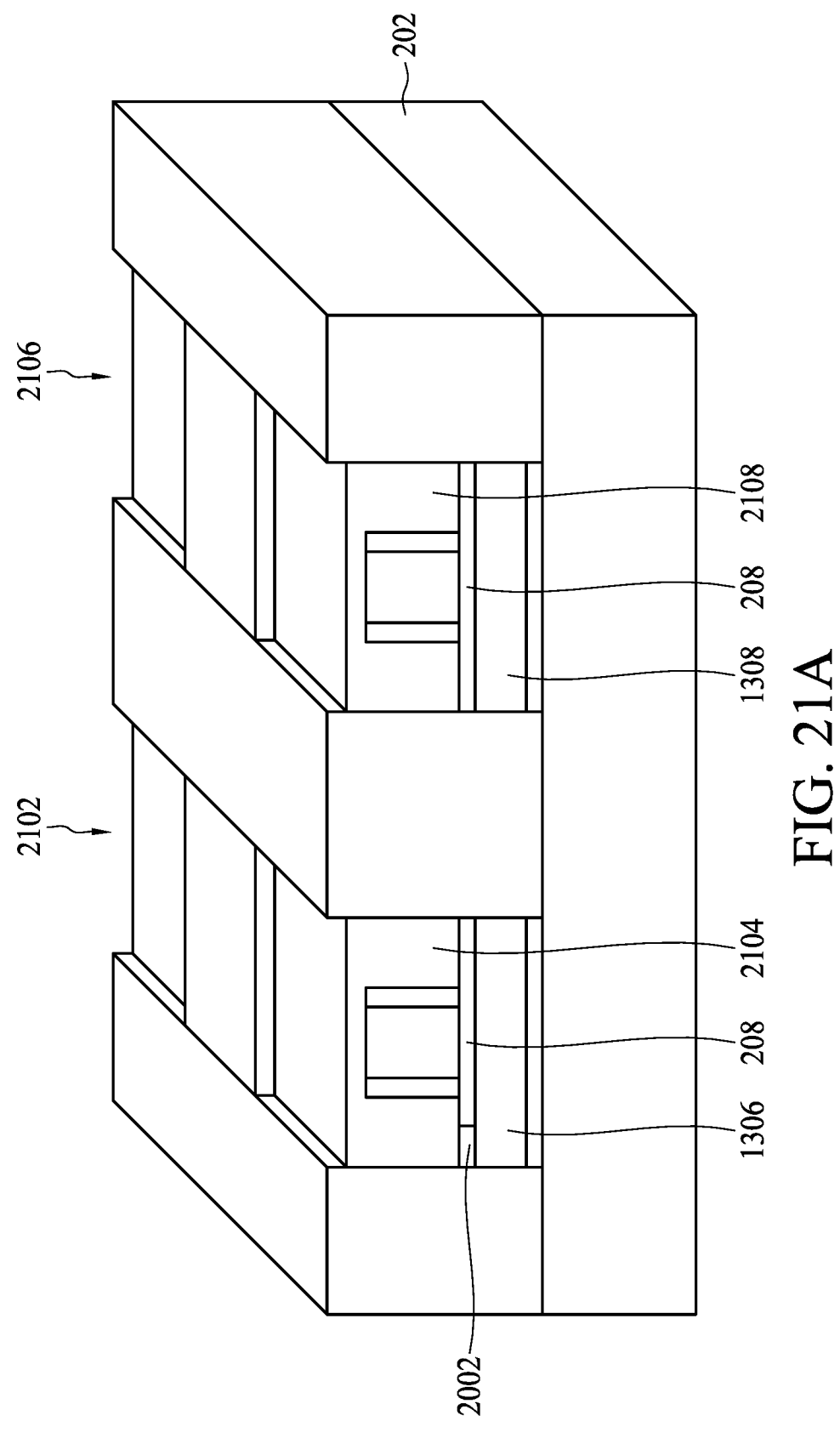
FIG. 21A is a diagram illustrating EPI layers formed on active devices in accordance with some embodiments.

In FIG. 21A, a first n-type epitaxial (NEPI) layer 2102, a second NEPI layer 2104, a first p-type epitaxial (PEPI) layer 2106, and a second PEPI layer 2108 are formed on the insulator layer 208 of the N-type FinFET and the P-type FinFET respectively. Specifically, the NEPI layers 2102 and 2104 are arranged to couple with or surround the fins 1502 and 1504, and the PEPI layers 2106 and 2108 are arranged to couple with or surround the fins 1506 and 1508. Moreover, the NEPI layer 2104 is also arranged to couple with the conductive via 2002. Accordingly, the NEPI layer 2104 is electrically connected with the conductive layer 1306. The NEPI layers 2102 and 2104 and the PEPI layers 2106 and 2106 are arranged to increase the stress and consequently to improve the performance of the N-type FinFET and the P-type FinFET respectively. The NEPI and PEPI layers may be conductive layer.

Figure 21B:
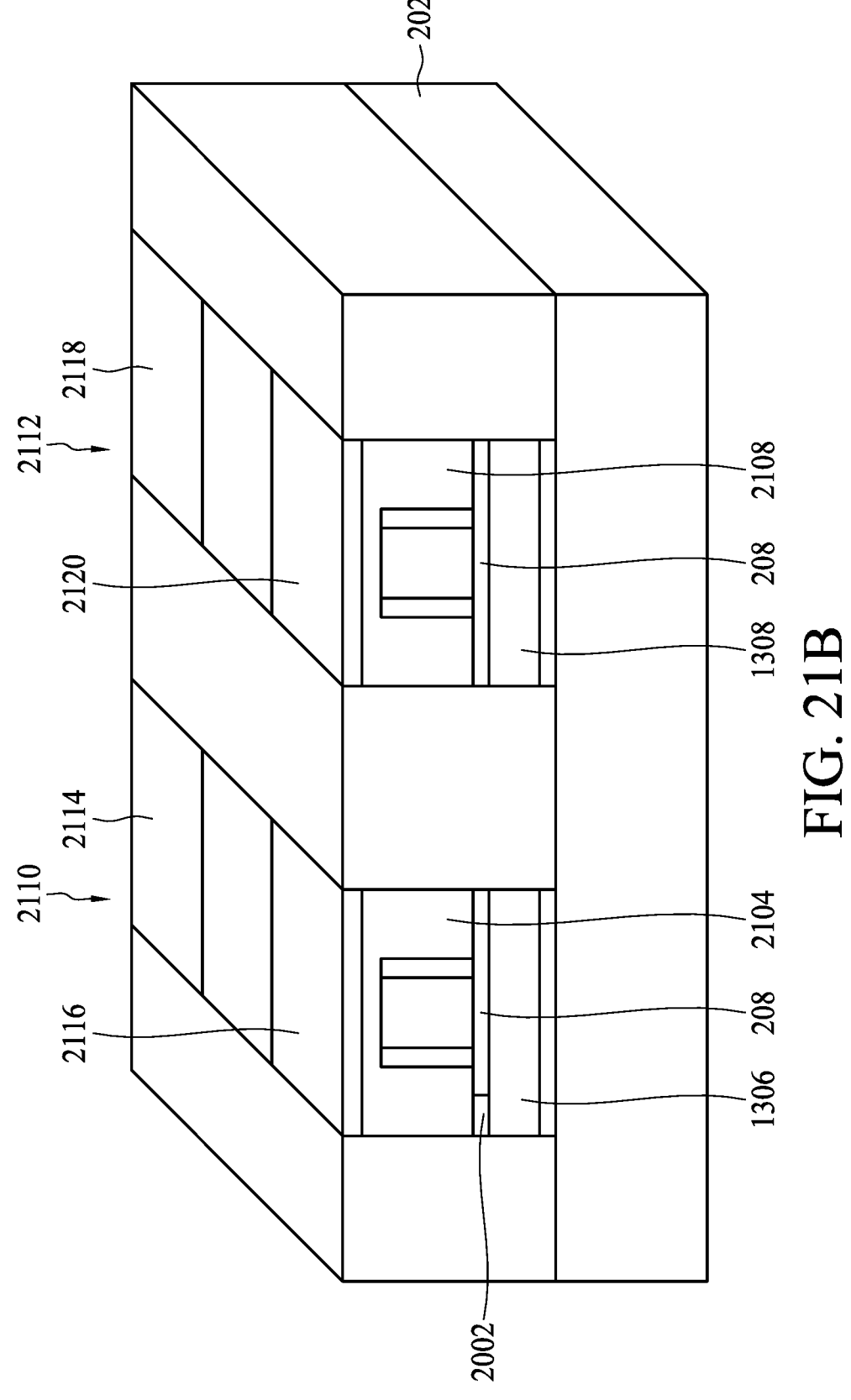
FIG. 21B is a diagram illustrating an N-type FinFET and a P-type FinFET in accordance with some embodiments.

In FIG. 21B, a first contact layer 2114, a second contact layer 2116, a third contact layer 2118, and a fourth contact layer 2120 are formed on the NEPI layers 2102, 2104, and PEPI layers 2106, and 2108 respectively. A contact layer may be a conductive layer formed on the source/drain diffusion region of a FET. Accordingly, the N-type FinFET (i.e. 2110) and the P-type FinFET (i.e. 2112) are formed on the silicon substrate 202 as shown in FIG. 21B.

According to some embodiments, when the conductive layers 1306 and 1308 are ion-implanted silicon layer formed in the front-end-of-line (FEOL), the metal ion pollution in the FEOL layer may be alleviated during the thermal process.

Figure 22:
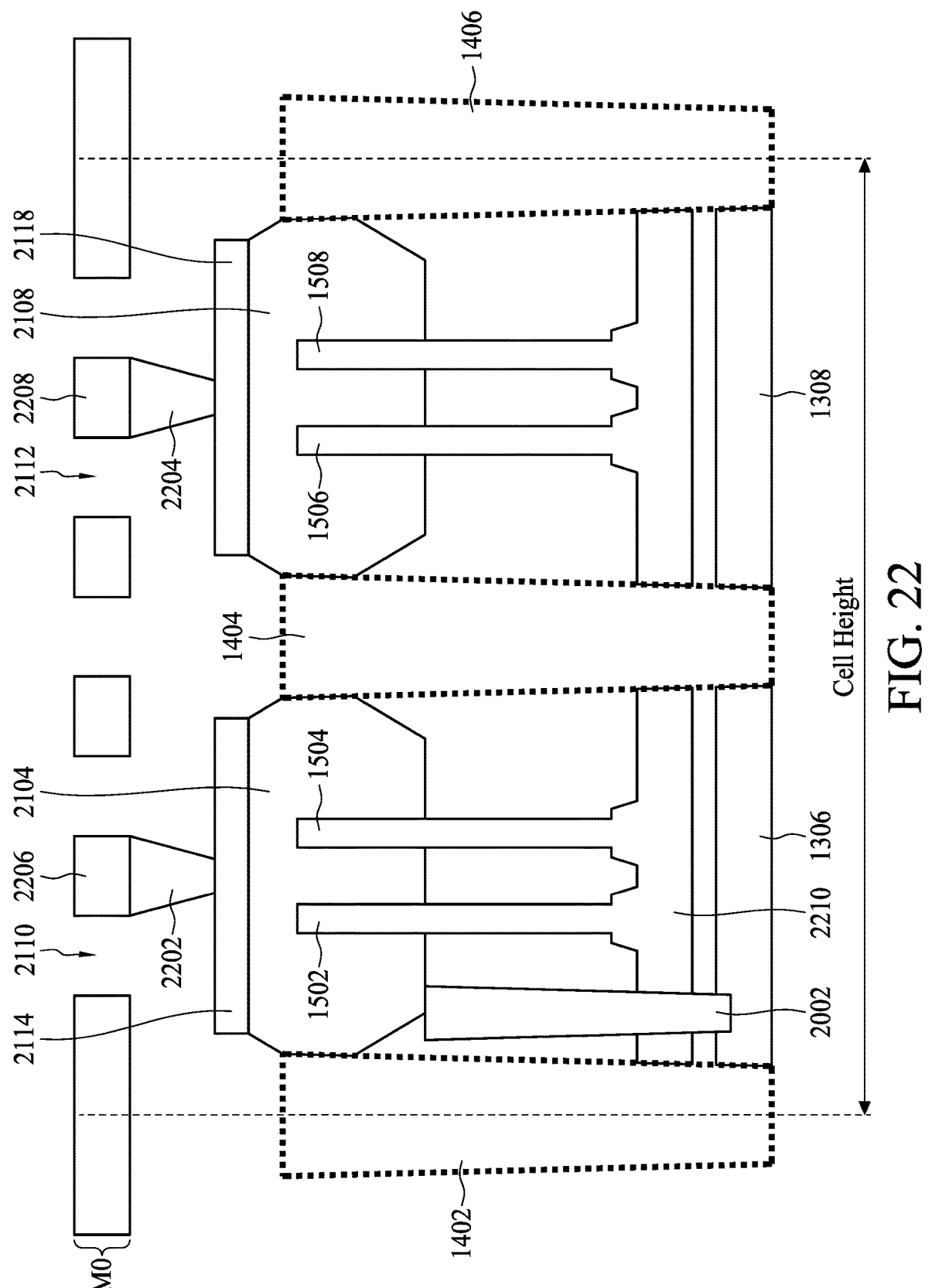
FIG. 22 is a diagram illustrating a cross sectional view of the N-type FinFET and the P-type FinFET in accordance with some embodiments.

FIG. 22 is a diagram illustrating a cross sectional view of the N-type FinFET 2110 and the P-type FinFET 2112 in accordance with some embodiments. The conductive layers 1306 and 1308 are disposed underneath the fins 1502, 1504, 1506, and 1508 respectively. The conductive via 2002 is arranged to penetrate the fin base 2210 to reach conductive layer 1306. In FIG. 22, a first contact 2202, a second contact 2204, and the first metal layer M0 are also shown. One end of the conductive via 2002 may couple or directly connect to the conductive layer 1306, and the other end of the conductive via 2002 may couple or directly connect to the NEPI layer 2104. The contact 2202 may be arranged to couple the contact layer 2114 (see FIG. 21B) and the metal track 2206 on the first metal layer M0, and the contact 2204 may be arranged to couple the contact layer 2118 (or 2120) and the metal track 2208 on the first metal layer M0.

Figure 23:
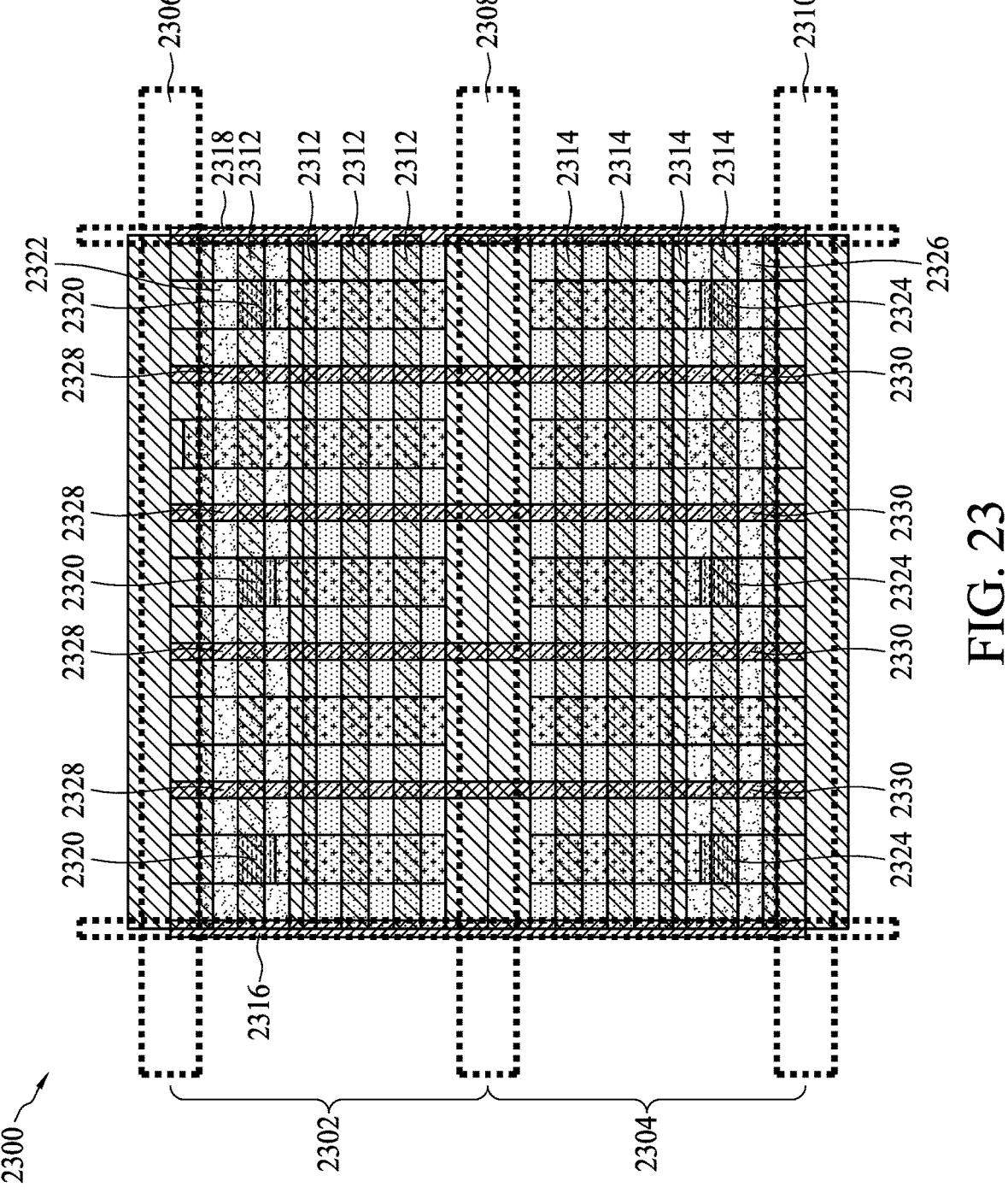
FIG. 23 is a diagram illustrating a top view of a circuit cell in accordance with some embodiments.

FIG. 23 is a diagram illustrating a top view of a circuit cell 2300 in accordance with some embodiments. The circuit cell 2300 may be formed by the above mentioned method 100. The circuit cell 2300 may comprise an N-type FinFET 2302 and a P-type FinFET 2304. The N-type FinFET 2302 and the P-type FinFET 2304 are isolated by a plurality of hybrid fins 2306, 2308, and 2310. The N-type FinFET 2302 comprises a plurality of semiconductor fins 2312. The P-type FinFET 2304 comprises a plurality of semiconductor fins 2314. A first CPODE structure 2316 is formed on a first boundary of the circuit cell 2300 while a second CPODE structure 2318 is formed on a second boundary of the circuit cell 2300. For the N-type FinFET 2302, a plurality of conductive vias 2320 are arranged to couple the NEPI layer of the N-type FinFET 2302 to the conductive layer 2322 formed underneath the N-type FinFET 2302. For the P-type FinFET 2304, a plurality of conductive vias 2324 are arranged to couple the PEPI layer of the P-type FinFET 2304 to the conductive layer 2326 formed underneath the P-type FinFET 2304. The gate or gate electrode of the N-type FinFET 2302 may be controlled by a plurality of polysilicon layers 2328, and the gate of the P-type FinFET 2304 may be controlled by a plurality of polysilicon layers 2330. In the circuit cell 2300, the structure of the CPODE structure 2316 (and 2318) is similar to the structure of the first polysilicon layer 1702 and the second polysilicon layer 1704, thus the CPODE structure 2316 (and 2318) may be formed by the process as shown in FIG. 16 and FIG. 17. In addition, the structures of the conductive vias 2320 (and 2324) and the conductive layer 2322 (and 2326) are similar to the structures of the conductive via 2002 and the conductive layer 1306 respectively, thus the conductive vias 2320 (and 2324) and the conductive layer 2322 (2326) may be formed by the process as shown in FIGS. 18-21. The detailed description of the forming of the above structures is omitted here for brevity.

Figure 24:
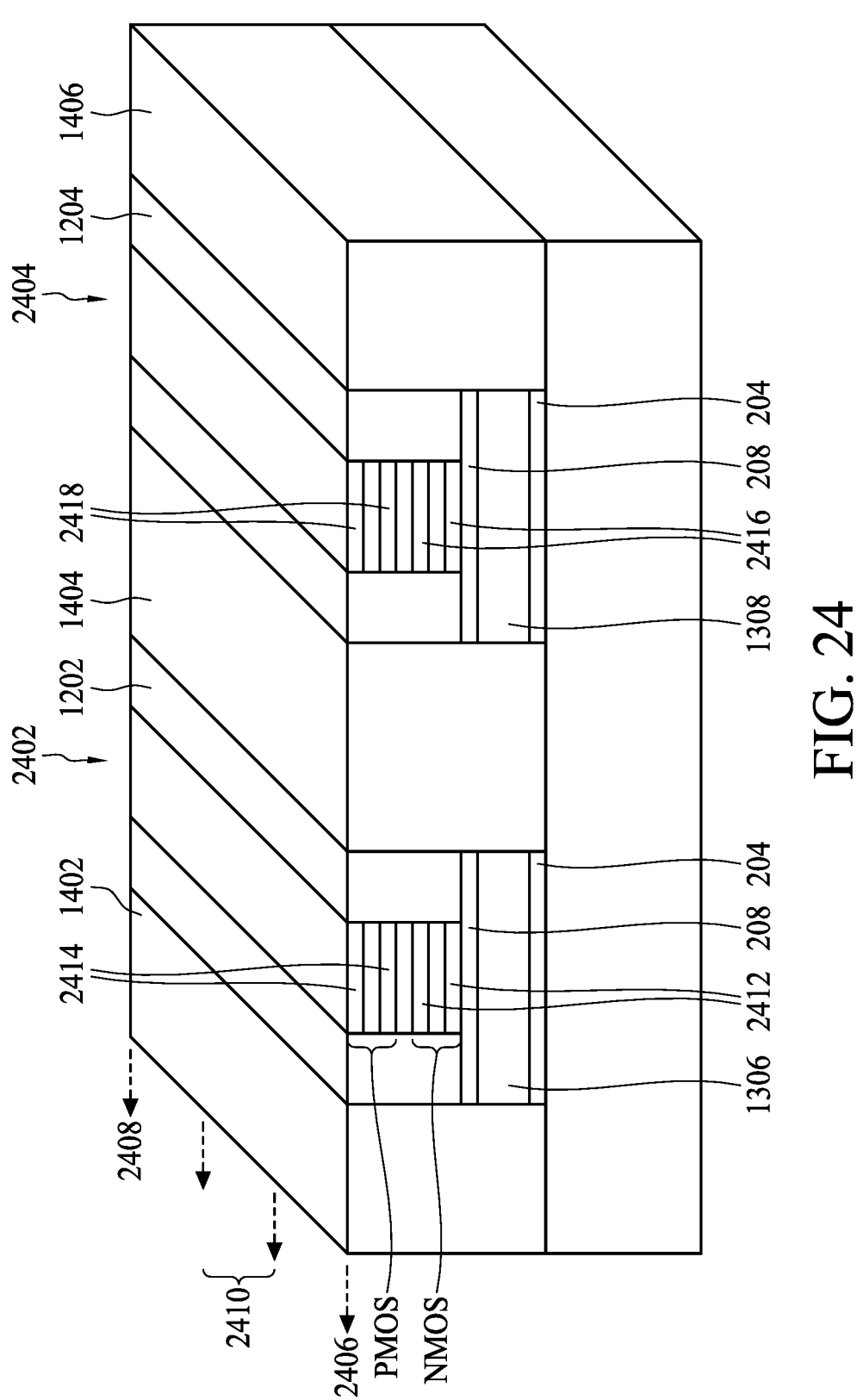
FIG. 24 is a diagram illustrating a first CFET structure and a second CFET structure in accordance with some embodiments.

Referring to the operation 106, in FIG. 24, a first CFET structure 2402 and a second CFET structure 2404 are formed in the first active region 1302 and the second active region 1304 respectively. The CFET structure 2402 and 2404 are extended from a cell boundary 2406 to the other cell boundary 2408 of the semiconductor device. The CFETs may be formed in the active region between the boundaries 2406 and 2408, and polysilicon structures may be formed on the boundaries 2406 and 2408 to cut off the conductive layers 1306 and 1308, wherein the polysilicon structures may be a CPODE structure. Moreover, for the CFET structure 2402 as well as 2404, an NMOS device is to be formed in the lower portion of the CFET structure 2402, and a PMOS device is to be formed in the upper portion of the CFET structure 2402. In addition, a CMP process may be applied to smooth the top surfaces of the CFET structures 2402 and 2404, the spacers 1202 and 1204, and the hybrid fins 1402, 1404, and 1406. In this embodiment, the NMOS devices of the CFET structures 2402 and 2404 comprise two fins 2412 and 2416 respectively, and the PMOS devices of the CFET structures 2402 and 2404 comprise two fins 2414 and 2418 respectively. The detailed description of the CFET structures 2402 and 2404 and the forming of the CFET structures 2402 and 2404 is omitted here for brevity.

Figure 25:
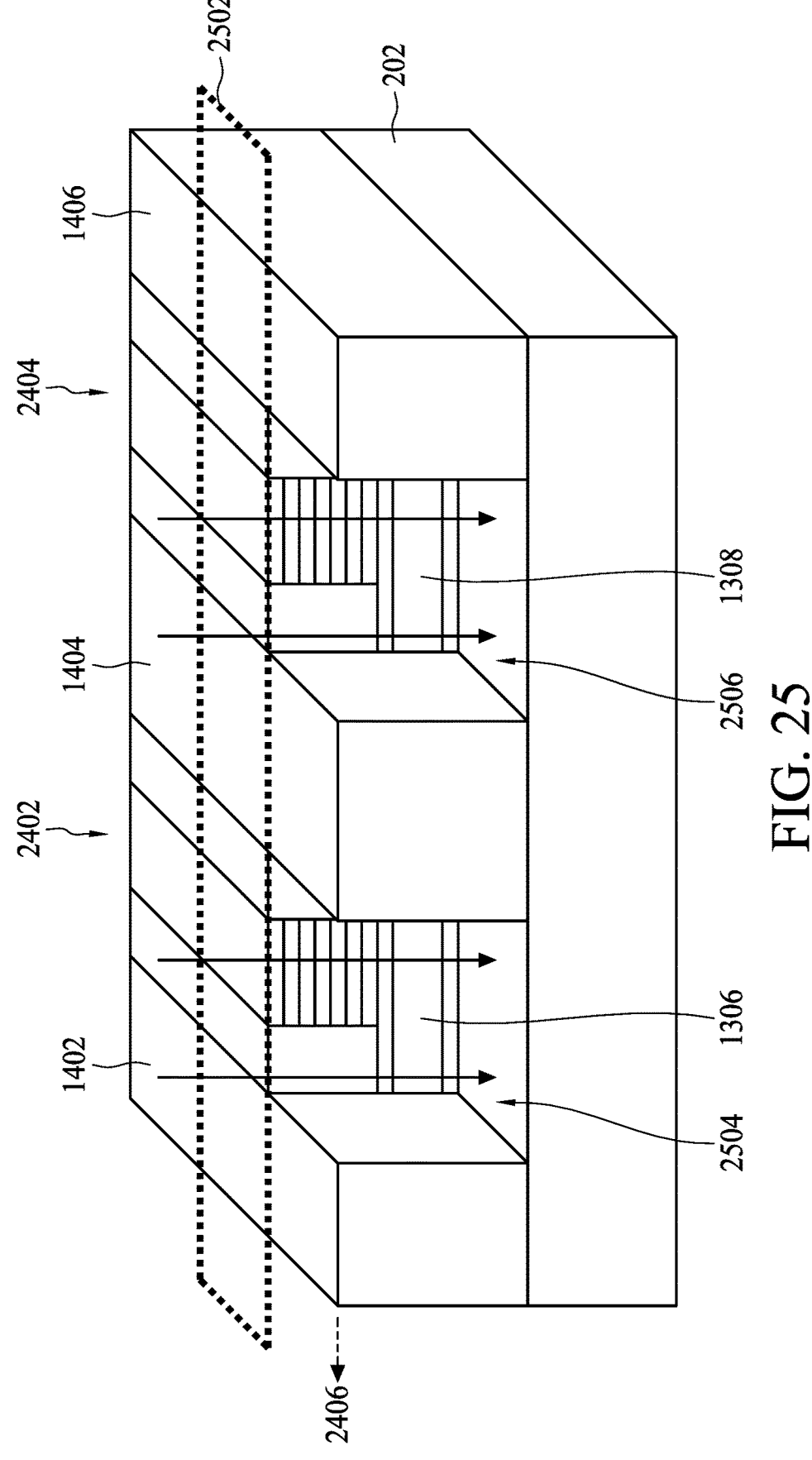
FIG. 25 is a diagram illustrating a first trench and a second trench formed on the boundary of the semiconductor structure in accordance with some embodiments.

According to some embodiments, for the boundary 2406 as well as 2408 of the semiconductor structure of FIG. 24, an etching process is performed upon the boundary 2406 of the semiconductor structure to cut off the CFET structures 2402 and 2404, and the conductive layers 1306 and 1308 as shown in FIG. 25. According to some embodiments, a boundary polysilicon layer is to be disposed beside the boundary 2408 of the semiconductor structure. Before the etching process, the location (i.e. 2502) of the boundary polysilicon layer is determined. Then, during the etching process, the materials (i.e. the CFET structures 2402 and 2404, the spacers 1202 and 1204, the insulator layers 208 and 204, and the conductive layers 1306 and 1308) along the direction of the boundary polysilicon layer are etched until the top surface of the silicon substrate 202 is exposed. It is noted that the hybrid fins 1402, 1404, and 1406 may not be etched during the etching process. After the etching process, a first trench 2504 and a second trench 2506 are formed on the boundary 2408 of the semiconductor structure.

Figure 26:
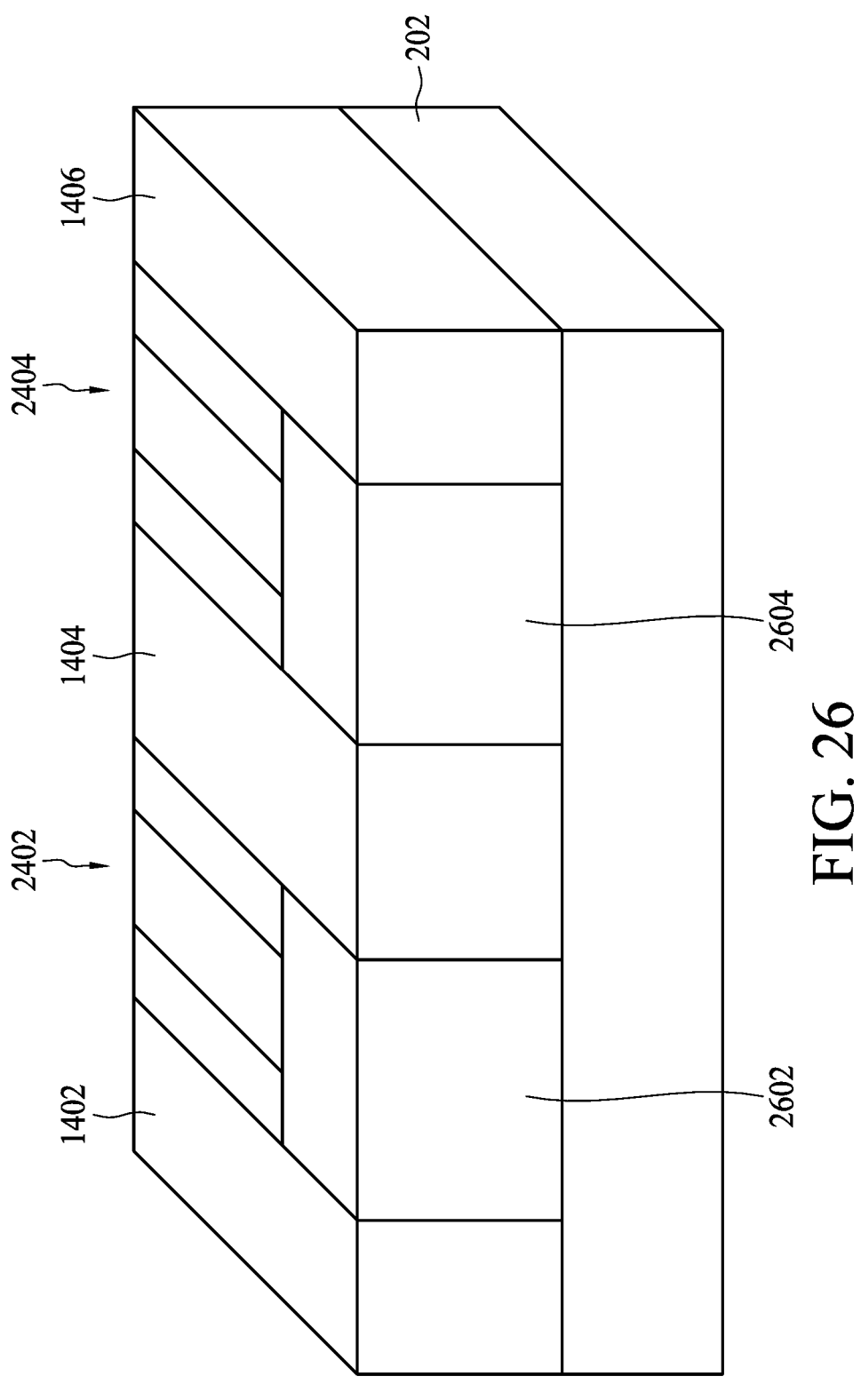
FIG. 26 is a diagram illustrating a first polysilicon layer and a second polysilicon layer formed on the boundary of the semiconductor structure in accordance with some embodiments.

In FIG. 26, a CPODE process is performed to form a first polysilicon layer 2602 and a second polysilicon layer 2604 in the first trench 2504 and the second trench 2506 for coupling the edges of the CFET structures 2402 and 2404, the spacers 1202 and 1204, the insulator layers 208 and 204, and the conductive layers 1306 and 1308 respectively. According to some embodiments, the polysilicon layers 2602 and 2604 are arranged to isolate the CFET structures 2402 and 2404 and the conductive layers 1306 and 1308 from the CFET structures and the conductive layers of the adjacent circuit cell (not shown) respectively.

Figure 27:
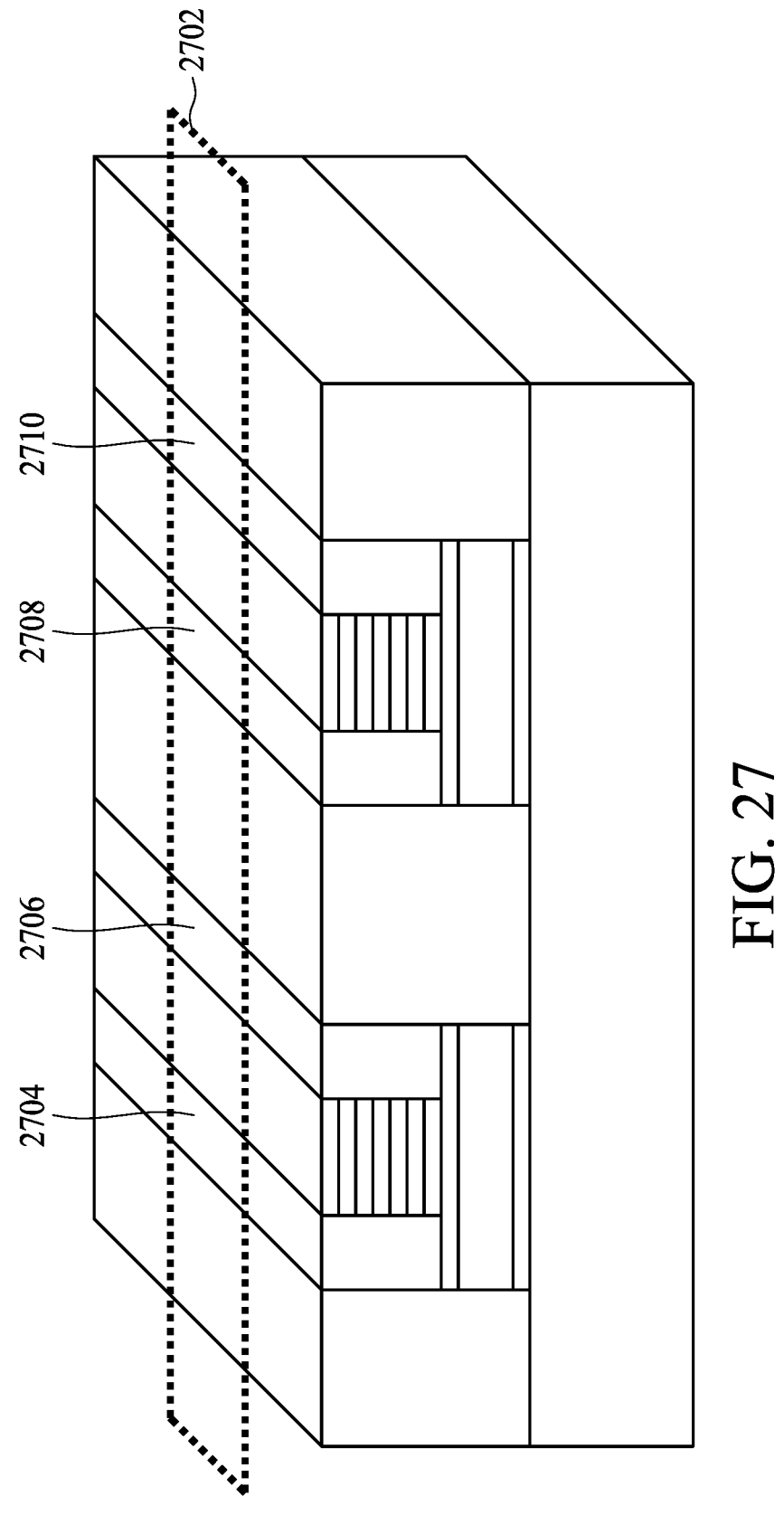
FIG. 27 is a diagram illustrating locations of the gates of active devices in accordance with some embodiments.

In operation 110, a first CFET and a second CFET are formed in the active device region (e.g. the portion 2410 as shown in FIG. 24) between the boundaries 2406 and 2408 of the semiconductor structure as shown in FIG. 24. FIG. 27 is a diagram illustrating the portion 2410 of active device region in accordance with some embodiments. In FIG. 27, the gates of the first CFET and the second CFET are to be formed. The locations of the gates of the first CFET and the second CFET may be overlapped with the location (i.e. 2702) of a polysilicon layer to be formed across the CFET structures 2402 and 2404.

When the locations of the gates of the first CFET and the second CFET are determined, the spacer portions 2704, 2706, 2708, and 2710 that are overlapped with the location 2702 of the polysilicon layer are etched to expose a portion of the first CFET and a portion of the second CFET respectively. Then, a first polysilicon layer 2802 and a second polysilicon layer 2804 are formed in the etched regions for coupling the portion of the first CFET and the portion of the second CFET respectively as shown in FIG. 28.

Figure 28:
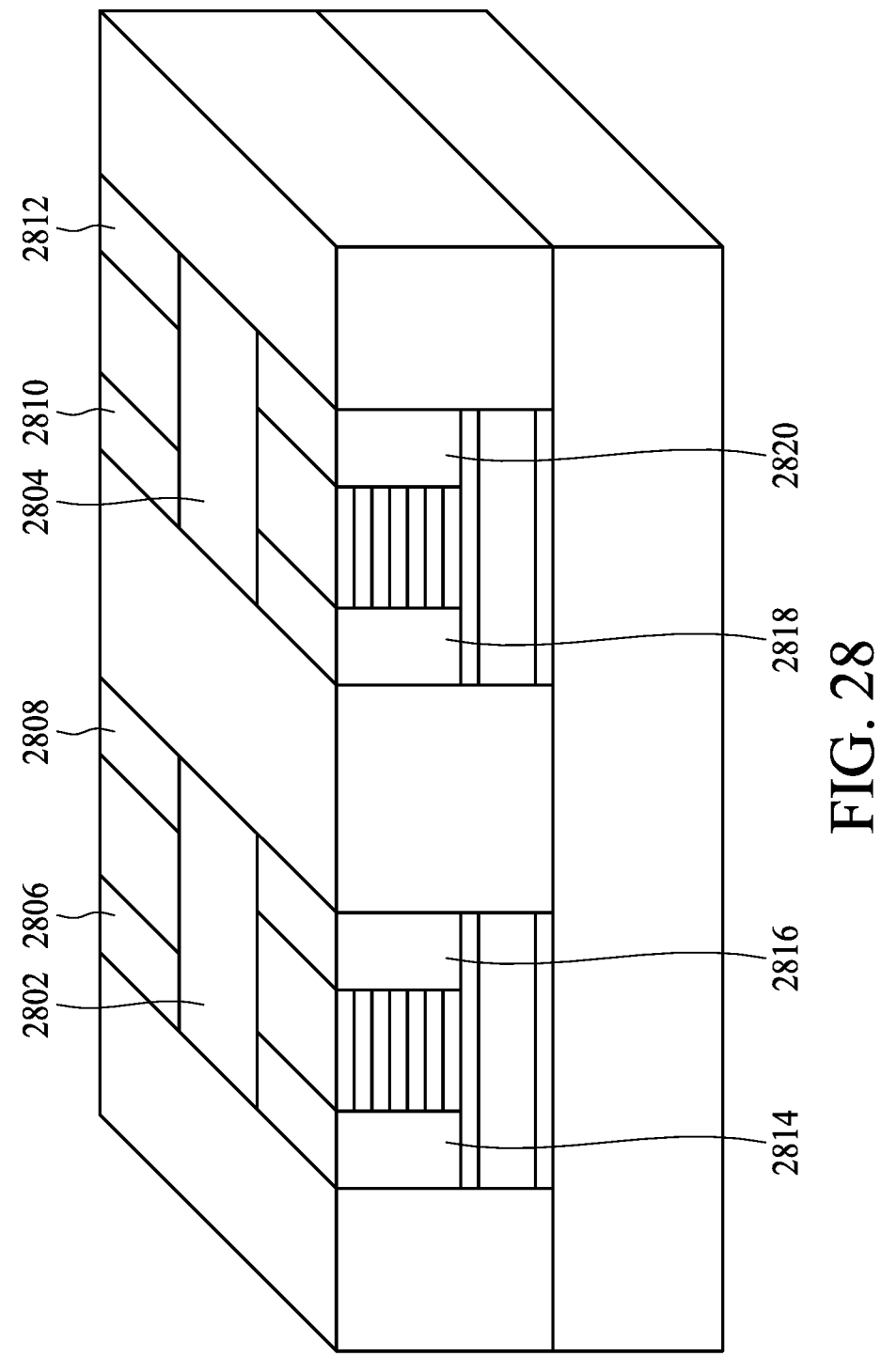
FIG. 28 is a diagram illustrating the gates of active devices in accordance with some embodiments.
Figure 29:
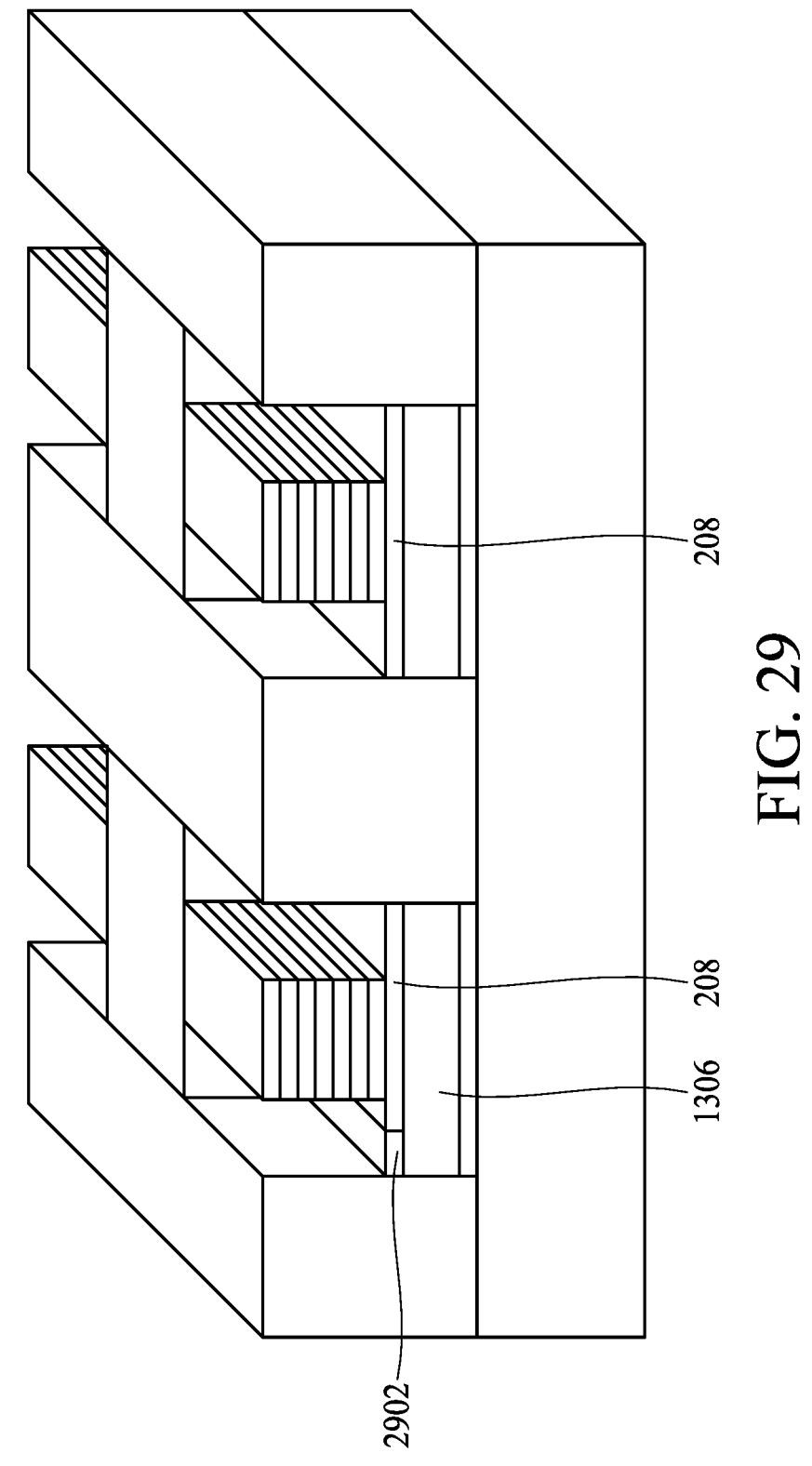
FIG. 29 is a diagram illustrating a conductive via formed on a buried conductive layer in accordance with some embodiments.

In FIG. 29, the spacer portions 2806, 2808, 2810, 2812, 2814, 2816, 2818, and 2820 of the contact regions (or source/drain diffusion regions) of the first CFET and the second CFET in FIG. 28 are removed to expose the insulator layer 208. Moreover, a portion of insulator layer 208 in the contact region of the first CFET is also removed to expose a portion of the conductive layer 1306. Then, a conductive via 2902 is formed on the exposed portion of the conductive layer 1306. It is noted that the embodiment is not limited by the location of the conductive via 2902, the conductive via 2902 may be formed in other contact regions of the first CFET and the second CFET.

Figure 30:
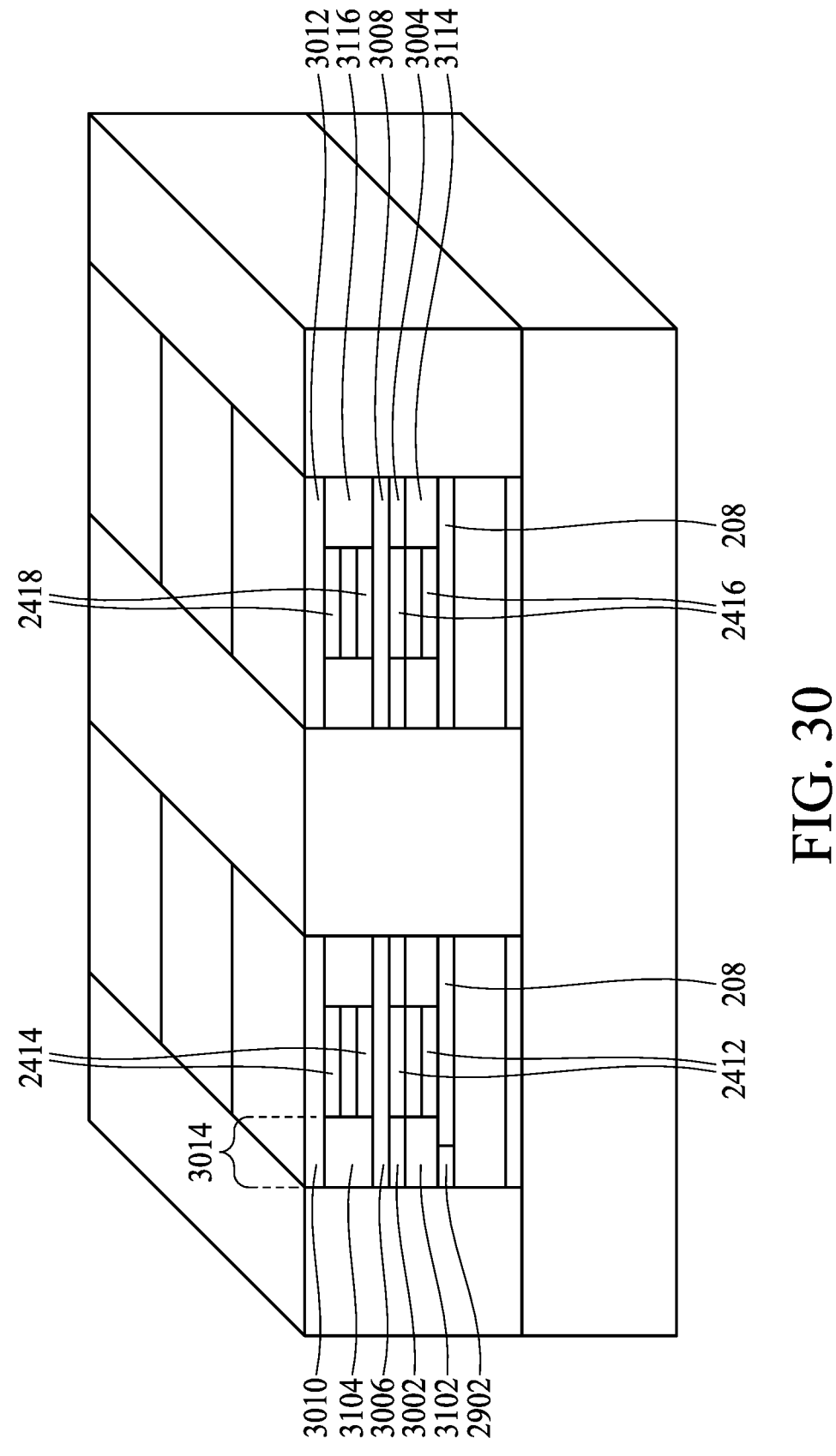
FIG. 30 is a diagram illustrating a first CFET and a second CFET in accordance with some embodiments.

In FIG. 30, a first NEPI layer 3102 and a second NEPI layer 3114 are formed on the insulator layer 208 of the NMOS devices of the first CFET and the second CFET respectively. The NEPI layer 3102 is also coupled with the conductive via 2902. A first middle diffusion layer at bottom (MDB) 3002 and a second MDB layer 3004 are formed on the first NEPI layer 3102 and the second NEPI layer 3114 respectively. A first isolation layer 3006 and a second isolation layer 3008 are formed on the first MDB layer 3002 and the second MDB layer 3004 respectively. A first PEPI layer 3104 and a second PEPI layer 3116 are formed on the first isolation layer 3006 and the second isolation layer 3008 of the NMOS devices of the first CFET and the second CFET respectively. A first middle diffusion layer at top (MDT) 3010 and a second MDT layer 3012 are formed on the first PEPI layer 3104 and the second PEPI layer 3116 respectively. The isolation layer 3006 is arranged to isolate the PEPI layer 3104 from the MDB layer 3002. The isolation layer 3008 is arranged to isolate the PEPI layer 3116 from the MDB layer 3004. According to some embodiments, the middle diffusion layers may be conductive layers.

Figure 31:
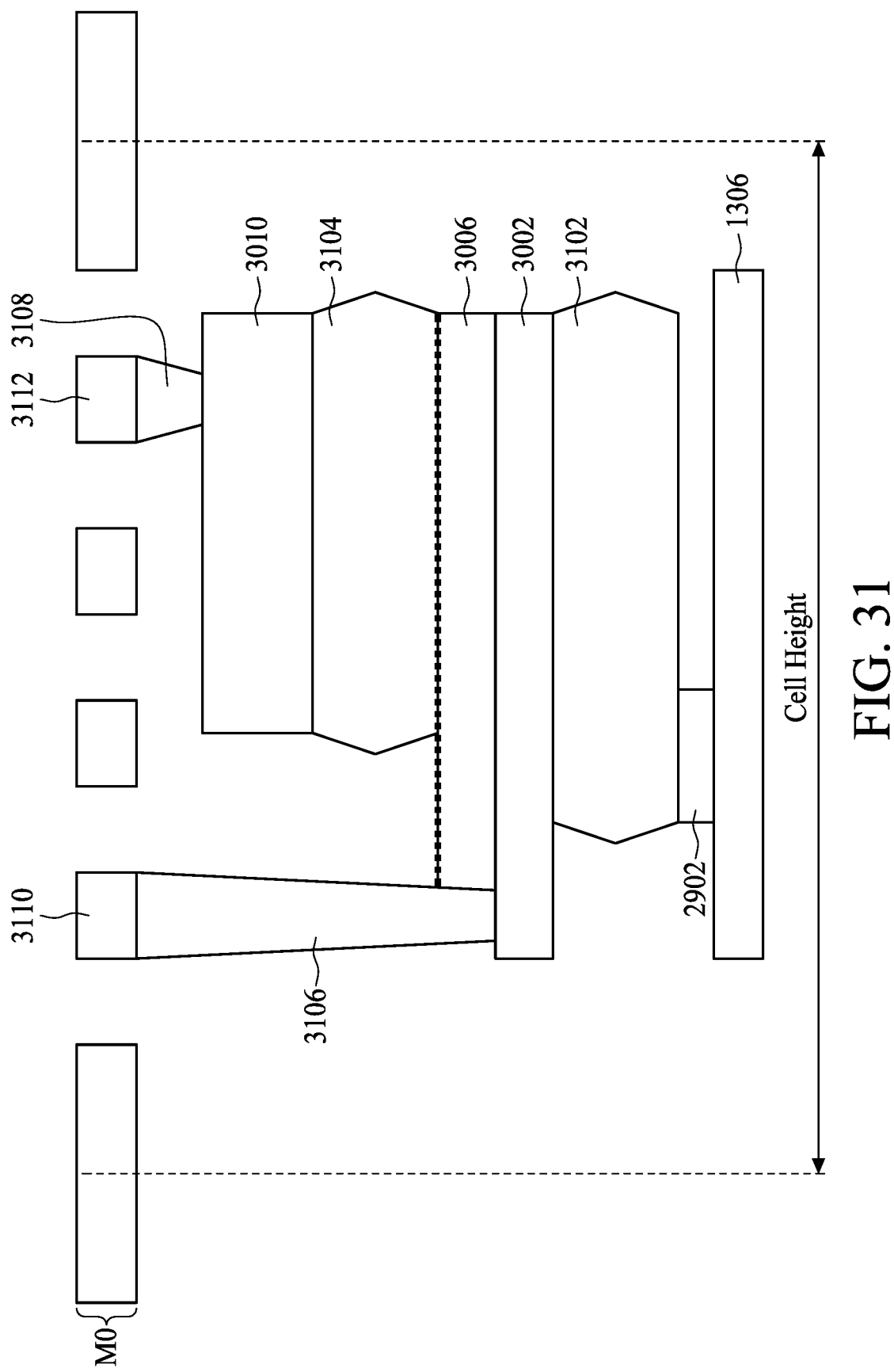
FIG. 31 is a diagram illustrating a cross sectional view of a portion of the first CFET in accordance with some embodiments.

FIG. 31 is a diagram illustrating a cross sectional view of a portion 3014 of the first CFET in accordance with some embodiments. The conductive layer 1306 is disposed underneath the first CFET. In FIG. 31, a conductive via 3106, a contact 3108, and a first metal layer M0 are also shown. The NEPI layer 3102 may be disposed between the conductive via 2902 and the MDB layer 3002. The PEPI layer 3104 may be disposed between the isolation layer 3006 and the MDT layer 3010. The conductive via 3106 may be arranged to couple the MDB layer 3002 to the metal track 3110 in the first metal layer M0. The conductive via 3108 may be arranged to couple the MDT layer 3010 to the metal track 3112 in the first metal layer M0.

Figure 32:
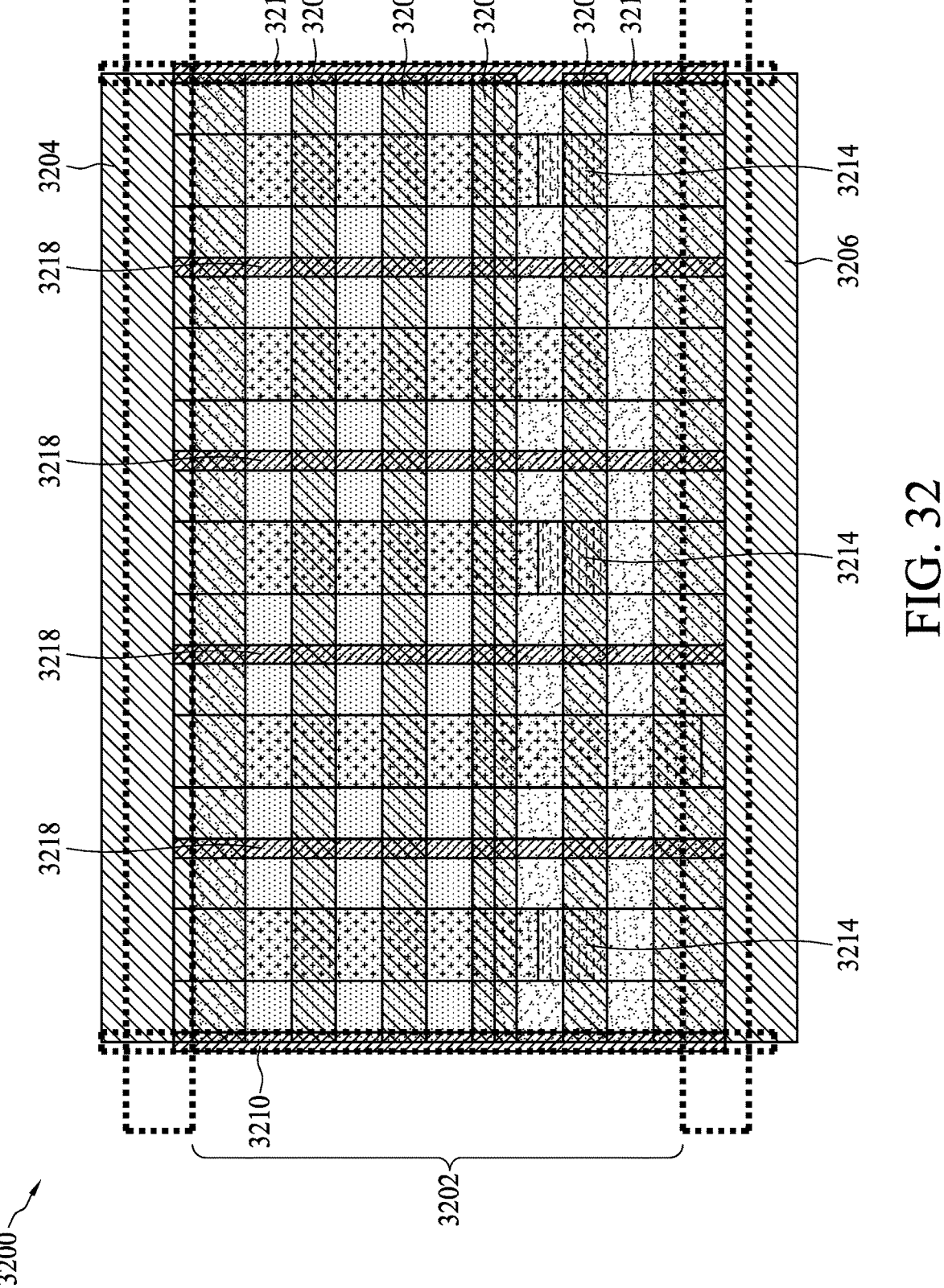
FIG. 32 is a diagram illustrating a top view of a circuit cell in accordance with some embodiments.

FIG. 32 is a diagram illustrating a top view of a circuit cell 3200 in accordance with some embodiments. The circuit cell 3200 may be formed by the above mentioned method 100. The circuit cell 3200 may comprise a CFET 3202. The CFET 3202 is isolated from other CFETs (not shown) by a plurality of hybrid fins 3204 and 3206. The CFET 3202 comprises a plurality of semiconductor fins 3208. A first CPODE structure 3210 is formed on a first boundary of the circuit cell 3200 while a second CPODE structure 3212 is formed on a second boundary of the circuit cell 3200. For the CFET 3202, a plurality of conductive vias 3214 are arranged to couple the NEPI layer of the NMOS device of the CFET 3202 to the conductive layer 3216 formed underneath the CFET 3202. The gate of the CFET 3202 may be controlled by a plurality of polysilicon layers 3218. In the circuit cell 3200, the structure of the CPODE structure 3210 (and 3212) is similar to the structure of the first polysilicon layer 2602 and the second polysilicon layer 2604, thus the CPODE structure 3210 (and 3212) may be formed by the process as shown in FIG. 25 and FIG. 26. In addition, the structures of the conductive vias 3214 and the conductive layer 3216 are similar to the structures of the conductive via 2902 and the conductive layer 1306 respectively, thus the conductive vias 3214 and the conductive layer 3216 may be formed by the process as shown in FIGS. 27-30. The detailed description of the forming of the a3ove structures is omitted here for brevity.

FIG. 33 is a flowchart illustrating a method 3300 of forming a semiconductor device in accordance with some embodiments. The semiconductor device may be a planar field-effect transistor (FET), a fin-like field-effect transistor (FinFET), a gate-all-around field-effect transistor (GAA FET), a complementary field-effect transistor (CFET), or a static random access memory (SRAM) comprised of the above mentioned transistors. The method 3300 comprises operations 3302-3312. Provided that substantially the same result is achieved, the operations of the flowchart shown in FIG. 33 may not follow the same order and may not be contiguous. In some embodiments, other intermediate operations may be included.

In operation 3302, a wafer with a buried conductive layer is provided. The operation 3302 and the wafer are similar to the operation 102 and FIG. 2 respectively, and thus the detailed description is omitted here for brevity. For brevity, the wafer provided in the operation 3302 is similar to the wafer 200 as shown in FIG. 2.

In operation 3304, active areas and hybrid fin areas are defined on the wafer 200. The operation 3304 is similar to the operation 104, and thus the detailed description is omitted here for brevity. Therefore, a plurality of hybrid fins, a first active area, and a second active area are formed in operation 3304. For brevity, the semiconductor structure formed in the operation 3304 is similar to the semiconductor structure as shown in FIG. 14.

Figure 34:
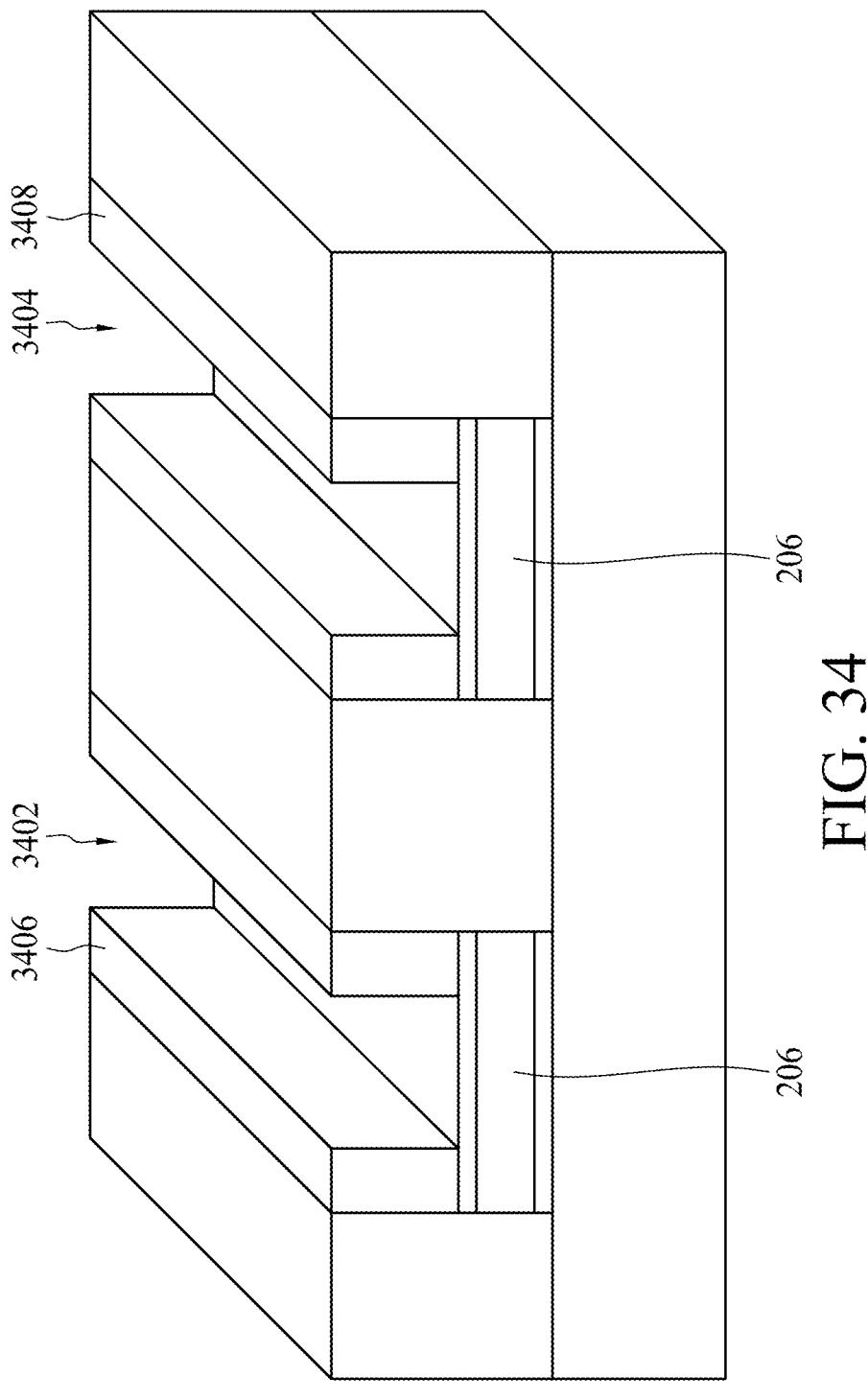
FIG. 34 is a diagram illustrating trenches and spacers formed in active regions in accordance with some embodiments.

In operation 3306 and FIG. 34, an etching process is performed upon the semiconductor structure as shown in FIG. 14 to form a first trench 3402, a second trench 3404, a first spacer 3406, and a second spacer 3408 in the first active region 1302 and the second active region 1304 respectively. The first trench 3402 and the second trench 3404 may expose the insulator layer 208.

Figure 35:
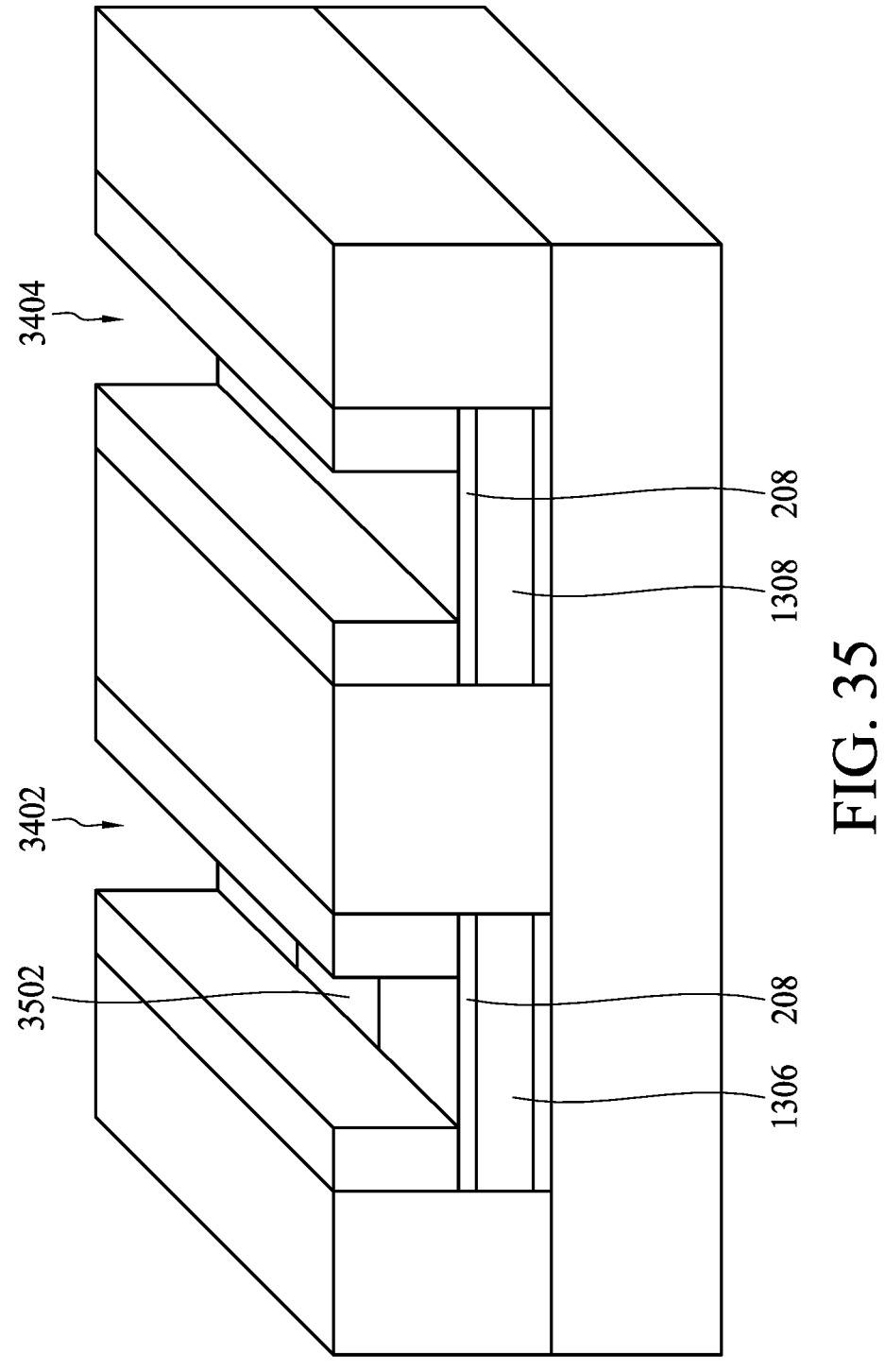
FIG. 35 is a diagram illustrating a conductive via formed in a first trench in accordance with some embodiments.

Moreover, in operation 3306 and FIG. 35, a conductive via 3502 is formed in the first trench 3402 for coupling the first conductive layer 1306. Specifically, when the first trench 3402 is formed, the conductive via 3502 may be formed in any position in the bottom of the first trench 3402. Then, an etching process is performed on a portion of the insulator layer 208 in the predetermined position to expose a portion of the first conductive layer 1306. Then, a deposition process is performed to form the conductive via 3502 on the corresponding portion of the first conductive layer 1306.

In operation 3308, a first specific active device and a second specific active device are to be formed in the first trench 3402 and the second trench 3404 respectively, wherein the first specific active device is to be couple with the conductive via 3502. For example, the specific active device may be an N/P-type planar FET, an N/P-type FinFET, an N/P-type GAA FET, or a CFET.

In operation 3310, the gate structures and the CPODE structures are formed in the first trench 3402 and the second trench 3404 respectively. For example, when the first specific active device is N-type FinFET and the second specific active device is P-type FinFET, a plurality of semiconductor fins may be formed in the first trench 3402 and the second trench 3404 respectively. Then, a plurality of CPODE structures may be formed on the boundaries of the plurality of semiconductor fins, and a plurality of gate structures may be formed on the plurality of semiconductor fins. The formation of the plurality of semiconductor fins, the plurality of CPODE structures, and the plurality of gate structures are similar to the operations as shown in FIG. 15-FIG. 19 respectively, and thus the detailed description is omitted here for brevity.

In addition, when the first specific active device and the second specific active device are CFETs, a plurality of semiconductor stacked fins may be formed in the first trench 3402 and the second trench 3404 respectively. Then, a plurality of CPODE structures may be formed on the boundaries of the plurality of semiconductor stacked fins, and a plurality of gate structures may be formed on the plurality of semiconductor stacked fins. The formation of the plurality of semiconductor stacked fins, the plurality of CPODE structures, and the plurality of gate structures are similar to the operations as shown in FIG. 24-FIG. 28 respectively, and thus the detailed description is omitted here for brevity.

In operation 3312, the contact structures of the first specific active device and the second specific active device are formed. For example, when the first specific active device is N-type FinFET and the second specific active device is P-type FinFET, a plurality of contact layers may be formed on the semiconductor fins adjacent to the gate electrodes respectively. The formation of the plurality of contact layers is similar to the operations as shown in FIG. 20-FIG. 21 respectively, and thus the detailed description is omitted here for brevity.

In addition, when the first specific active device and the second specific active device are CFETs, a plurality of contact layers may be formed on the semiconductor stacked fins adjacent to the gate electrodes respectively. The formation of the plurality of contact layers is similar to the operations as shown in FIG. 29-FIG. 30 respectively, and thus the detailed description is omitted here for brevity.

Figure 36:
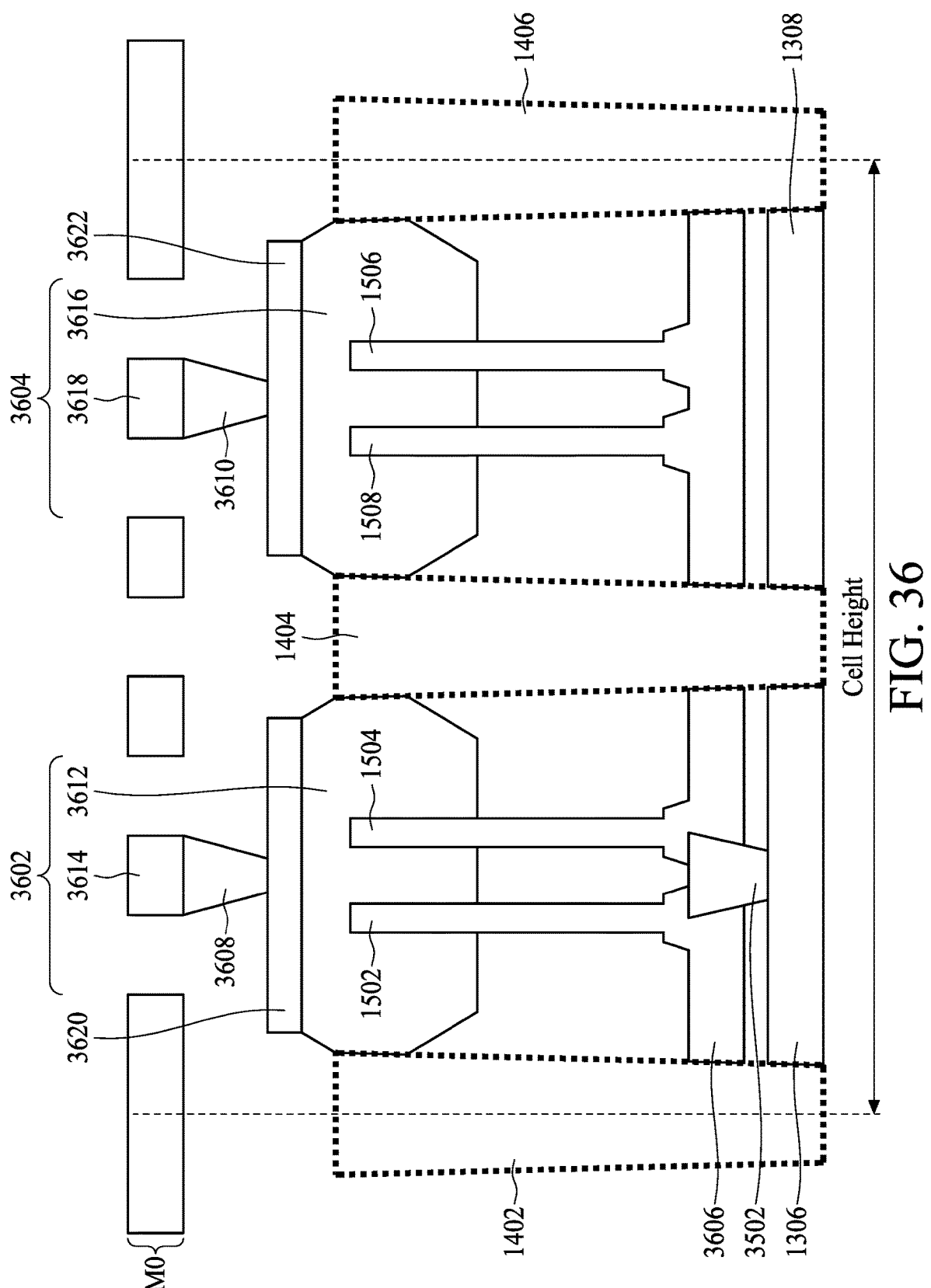
FIG. 36 is a diagram illustrating a cross sectional view of an N-type FinFET and a P-type FinFET in accordance with some embodiments.

FIG. 36 is a diagram illustrating a cross sectional view of an N-type FinFET 3602 and a P-type FinFET 3604 in accordance with some embodiments. The N-type FinFET 3602 and a P-type FinFET 3604 are formed by using the operations 3302-3312. According to some embodiments, the conductive layers 1306 and 1308 are disposed underneath the fins 1502, 1504, 1506, and 1508 respectively. The conductive via 3502 is arranged to couple with the fin base 3606 of the fins 1502 and 1504. One end of the conductive via 3502 may couple or directly connect to the conductive layer 1306, and the other end of the conductive via 3502 may couple or directly connect to the fin base 3606. In FIG. 36, a first contact 3608, a second contact 3610, the first metal layer M0, a first contact layer 3620, and a second contact layer 3622 are also shown. The contact 3608 may be arranged to couple the contact layer 3620 and the metal track 3614 on the first metal layer M0, and the contact 3610 may be arranged to couple the contact layer 3622 and the metal track 3618 on the first metal layer M0.

Figures 37A, 37B:
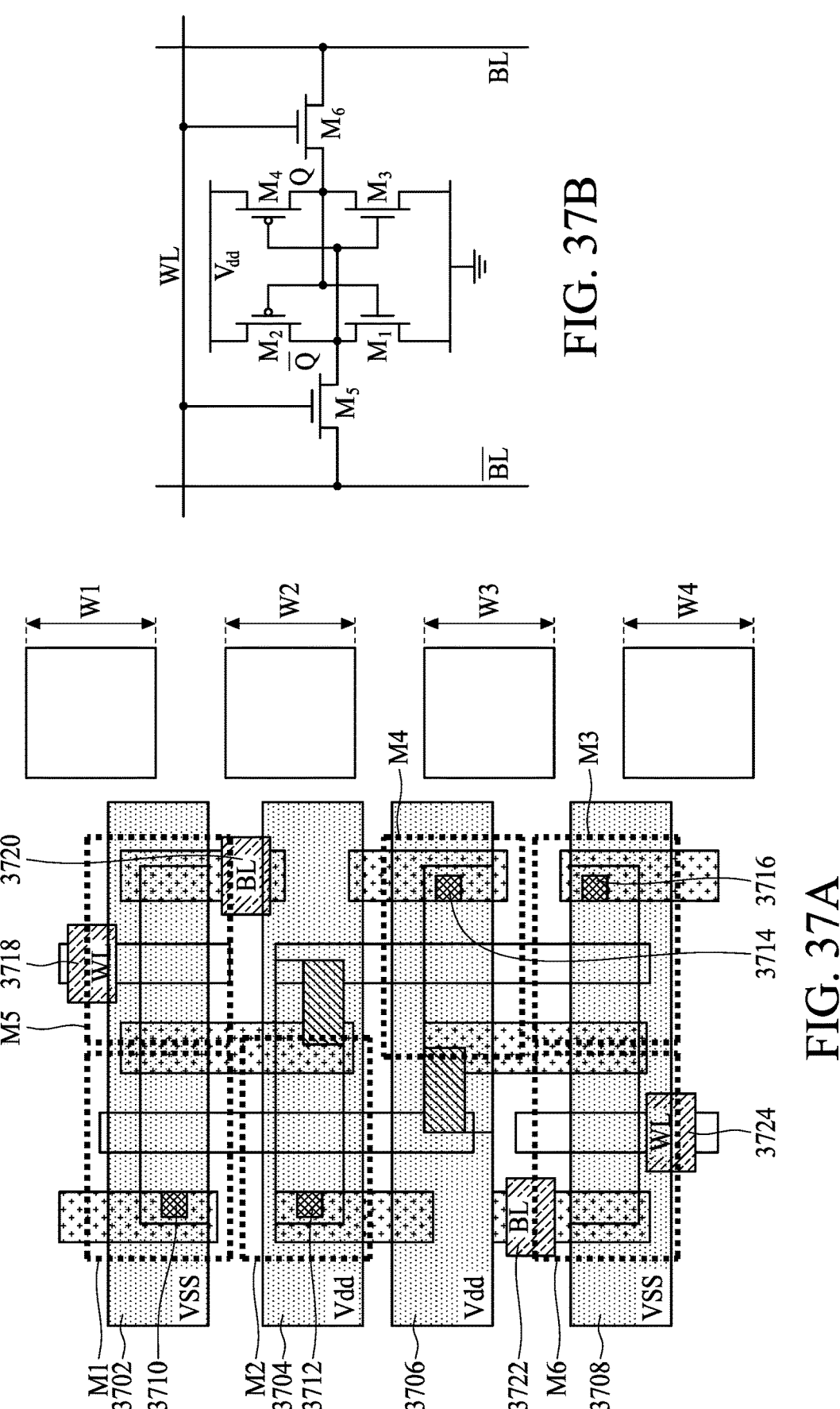
FIG. 37A is a diagram illustrating an SRAM cell in accordance with some embodiments.
FIG. 37B is a circuit diagram illustrating the SRAM cell in accordance with some embodiments.

FIG. 37A is a diagram illustrating an SRAM cell 3700 in accordance with some embodiments. The SRAM cell 3700 may be implemented by the method 100 or 3300. The SRAM cell 3700 comprises four NMOS transistors M1, M3, M5, and M6, and two PMOS transistors M2 and M4. The connectivity of the transistors M1, M2, M3, M4, M5, and M6 are shown in FIG. 37B, which is a circuit diagram illustrating the SRAM cell 3700 in accordance with some embodiments. In FIG. 37A, the SRAM cell 3700 comprises a first buried conductive layer 3702 formed underneath the transistors M1 and M5, a second buried conductive layer 3704 formed underneath the transistor M2, a third buried conductive layer 3706 formed underneath the transistor M4, and a fourth buried conductive layer 3708 formed underneath the transistors M3 and M6. The buried conductive layers 3702 and 3708 are similar to the above mentioned conductive layer 1306, and the buried conductive layers 3704 and 3706 are similar to the above mentioned conductive layer 1308, and thus the detailed description is omitted here for brevity.

Moreover, the buried conductive layers 3702 and 3708 are electrically connected to a ground voltage Vss, and the buried conductive layers 3704 and 3706 are electrically connected to a supply voltage Vdd. According to some embodiments, the source of the transistor M1 is coupled to the buried conductive layer 3702 by a first conductive via 3710, the source of the transistor M2 is coupled to the buried conductive layer 3704 by a second conductive via 3712, the source of the transistor M4 is coupled to the buried conductive layer 3706 by a third conductive via 3714, and the source of the transistor M3 is coupled to the buried conductive layer 3708 by a fourth conductive via 3716. The vias 3710, 3712, 3714, and 3716 are similar to the above mentioned conductive via 2902 or 3502, and thus the detailed description is omitted here for brevity.

In addition, the gate (i.e. the word line WL) of the transistor M5 is coupled to a first metal line 3718 in the first metal layer M0, the source or drain (i.e. the bit line BL) of the transistor M5 is coupled to a second metal line 3720 in the first metal layer M0, the source or drain (i.e. the bit line BL) of the transistor M6 is coupled to a third metal line 3722 in the first metal layer M0, and the gate (i.e. the word line WL) of the transistor M6 is coupled to a fourth metal line 3724 in the first metal layer M0.

As the buried conductive layers 3702, 3704, 3706, and 3708 are disposed underneath the SRAM cell 3700, the widths of the buried conductive layers 3702, 3704, 3706, and 3708 may be increased. Therefore, the resistances of the buried conductive layers 3702, 3704, 3706, and 3708 that are arranged to provide the supply power Vdd or Vss of the SRAM cell 3700 may be decreased. Moreover, as the conductive lines of the supply power Vdd or Vss of the SRAM cell 3700 is changed to the buried conductive layers 3702, 3704, 3706, and 3708, the widths W1, W2, W3, and W4 of the metal lines 3718, 3720, 3722, and 3724 in the first metal layer M0 may be increased. Therefore, the resistances of the metal lines 3718, 3720, 3722, and 3724 that are arranged to transmit the word line signals and the bit line signals of the SRAM cell 3700 may be decreased respectively.

Figure 38:
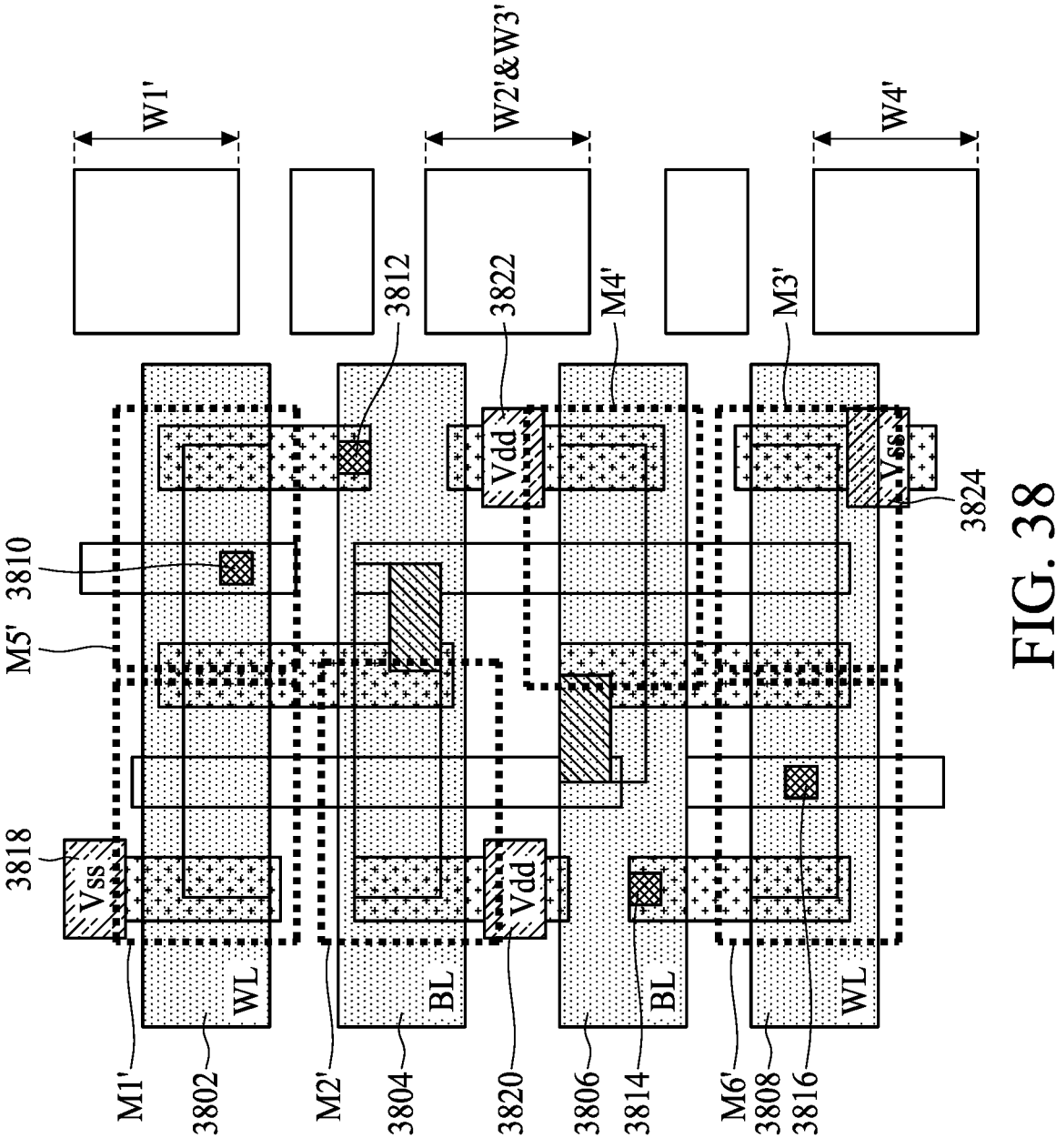
FIG. 38 is a diagram illustrating an SRAM cell in accordance with some embodiments.

FIG. 38 is a diagram illustrating an SRAM cell 3800 in accordance with some embodiments. The SRAM cell 3800 may be implemented by the method 100 or 3300. The SRAM cell 3800 comprises four NMOS transistors M1', M3', M5', and M6', and two PMOS transistors M2' and M4'. The connectivity of the transistors M1', M2', M3', M4', M5', and M6' may be referred to FIG. 37B. In FIG. 38, the SRAM cell 3800 comprises a first buried conductive layer 3802 formed underneath the transistors M1' and M5', a second buried conductive layer 3804 formed underneath the transistor M2', a third buried conductive layer 3806 formed underneath the transistor M4', and a fourth buried conductive layer 3808 formed underneath the transistors M3' and M6'. The buried conductive layers 3802 and 3808 are similar to the above mentioned conductive layer 1306, and the buried conductive layers 3804 and 3806 are similar to the above mentioned conductive layer 1308, and thus the detailed description is omitted here for brevity.

Moreover, the gate (i.e. the word line WL) of the transistor M5' is coupled to the buried conductive layer 3802 by a first conductive via 3810, the source or drain (i.e. the bit line BL) of the transistor M5' is coupled to the buried conductive layer 3804 by a second conductive via 3812, the source or drain (i.e. the bit line BL) of the transistor M6' is coupled to the buried conductive layer 3806 by a third conductive via 3814, and the gate (i.e. the word line WL) of the transistor M6' is coupled to the buried conductive layer 3808 by a fourth conductive via 3016. The vias 3810, 3812, 3814, and 3816 are similar to the above mentioned conductive via 2902 or 3502, and thus the detailed description is omitted here for brevity.

In addition, the source of the transistor M1' is coupled to a first metal line 3818 in the first metal layer M0, the source of the transistor M2' is coupled to a second metal line 3820 in the first metal layer M0, the source of the transistor M4' is coupled to a third metal line 3822 in the first metal layer M0, and the source of the transistor M3' is coupled to a fourth metal line 3824 in the first metal layer M0.

As the buried conductive layers 3802, 3804, 3806, and 3808 are disposed underneath the SRAM cell 3800, the widths of the buried conductive layers 3802, 3804, 3806, and 3808 may be increased. Therefore, the resistances of the buried conductive layers 3802, 3804, 3806, and 3808 that are arranged to transmit the word line signals and the bit line signals of the SRAM cell 3800 may be decreased respectively. Moreover, as the conductive lines of the word line signals and the bit line signals of the SRAM cell 3800 is changed to the buried conductive layers 3802, 3804, 3806, and 3808, the widths W1', W2', W3', and W4' of the metal lines 3818, 3820, 3822, and 3824 in the first metal layer M0 may be increased respectively. Therefore, the resistances of the metal lines 3818, 3820, 3822, and 3824 that are arranged to provide the supply power Vdd or Vss of the SRAM cell 3800 may be decreased respectively.

Briefly, the proposed embodiments decrease the resistance or IR drop of metal line and increase the cell routing resource (e.g. decrease cell area) of a circuit cell by forming a buried conductive layer in the front-end-of line (FEOL) layer. Moreover, as the buried conductive layer is an ion-implanted silicon layer, the metal ion pollution in the FEOL layer may be alleviated during the thermal process.

In some embodiments, the present disclosure provides a method of forming a semiconductor device. The method comprises: forming a wafer having an ion-implanted silicon layer, wherein the ion-implanted silicon layer is disposed between a first insulator layer and a second insulator layer inside the wafer; forming an active region over the ion-implanted silicon layer; forming an active device in the active region; and forming a conductive via to couple the ion-implanted silicon layer and the active device.

In some embodiments, the present disclosure provides a method for forming a wafer. The method includes following operations. Oxygen ions are implanted into a semiconductor wafer. A first anneal operation is performed to form a first insulator layer in the semiconductor wafer. A conductive layer is formed over the first insulator layer. Oxygen ions are implanted into the conductive layer. A second anneal operation is performed to form a second insulator layer in the conductive layer.

In some embodiments, the present disclosure provides a method for forming a semiconductor device is provided. The method includes following operations. A wafer including a buried conductive layer is formed. The buried conductive layer is disposed between a first insulator layer and a second insulator layer inside the wafer. An active region is formed in the buried conductive layer. A conductive via is formed to couple to the buried conductive layer. An active device is formed in the active region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   forming a wafer having an ion-implanted silicon layer, wherein the ion-implanted silicon layer is disposed between a first insulator layer and a second insulator layer inside the wafer;
   forming an active region over the ion-implanted silicon layer;
   forming an active device in the active region; and
   forming a conductive via to couple the ion-implanted silicon layer and the active device.

2. The method of claim 1, wherein the forming of the active device in the active region comprises:
   forming a semiconductor fin structure in the active region; and
   forming a gate electrode on a first portion of the semiconductor fin structure.

3. The method of claim 2, wherein the forming of the conductive via to couple the ion-implanted silicon layer and the active device comprises:
   etching a portion of the first insulator layer;
   forming the conductive via over a portion of the ion-implanted silicon layer; and
   forming a contact layer over a second portion of the semiconductor fin structure to couple the conductive via.

4. The method of claim 1, wherein the forming of the conductive via to couple the ion-implanted silicon layer and the active device comprises:
   etching the active region to expose a portion of the first insulator layer;
   etching a portion of the first insulator layer; and
   forming the conductive via over a portion of the ion-implanted silicon layer.

5. The method of claim 4, wherein the forming of the active device in the active region comprises:
   forming a semiconductor fin base over the portion of the first insulator layer and the conductive via;
   forming a semiconductor fin structure on the semiconductor fin base; and
   forming a gate electrode and a contact layer on the semiconductor fin structure.

6. The method of claim 1, wherein the active device, the ion-implanted silicon layer, the first insulator layer, and the second insulator layer are arranged to extend to a first boundary from a second boundary of the semiconductor device, and the method further comprises:

etching the active device, the ion-implanted silicon layer, the first insulator layer, and the second insulator layer on at least one of the first boundary and the second boundary; and
   forming a polysilicon layer for coupling an edge of the active device, an edge of the ion-implanted silicon layer, an edge of the first insulator layer, and an edge of the second insulator layer.

7. A method of forming a semiconductor device, comprising:
   forming a wafer having a buried conductive layer, wherein the buried conductive layer is disposed between a first insulator layer and a second insulator layer inside the wafer;
   defining an active region over the buried conductive layer;
   forming a trench in the active region, wherein the first insulator layer is exposed through a bottom of the trench;
   forming a conductive via coupled to the buried conductive layer; and
   forming an active device in the active region.

8. The method of claim 7, wherein the forming of the conductive via to couple the conductive layer comprises:
   etching a portion of the first insulator layer to expose a portion of the buried conductive layer; and
   forming the conductive via over the portion of the buried conductive layer.

9. The method of claim 7, further comprising forming an isolation fin adjacent to the active region.

10. The method of claim 7, wherein the conductive via is formed in the first insulator layer exposed through the bottom of the trench.

11. The method of claim 7, wherein the active device is formed in the trench.

12. The method of claim 7, further comprising forming a spacer over sidewalls of the trench.

13. A method of forming a semiconductor device, comprising:
   receiving a substrate comprising a first insulator layer, a second insulator layer, a conductive layer between the first insulator layer and the second insulator layer, and a first semiconductor layer disposed over the first insulator layer;
   removing portions of the first insulator layer, portions of the second insulator layer and portions of the conductive layer to form an active region;
   forming an isolation fin adjacent to the active region; and
   forming a conductive via penetrating the first insulator layer and coupled to the conductive layer.

14. The method of claim 13, further comprising:
   removing portions of the first semiconductor layer to expose the first insulator layer; and
   forming a spacer over sidewalls of a remaining portion of the first semiconductor layer,
   wherein the remaining portion of the first semiconductor layer and the spacer form a mask structure, and the removing of the portions of the first insulator layer, the portions of the second insulator layer and the portions of the conductive layer is performed through the mask structure.

15. The method of claim 13, further comprising forming at least a fin structure in the active region.

16. The method of claim 15, further comprising performing a planarization on the fin structure and the active region.

17. The method of claim 15, further comprising form a second semiconductor layer in the active region, wherein the second semiconductor layer is coupled to the fin structure.

18. The method of claim 15, further comprising forming an epitaxial layer in the active region, wherein the epitaxial layer is coupled to the conductive via and the fin structure.

19. The method of claim 18, further comprising forming a contact layer over the epitaxial layer.

20. The method of claim 17, wherein the second semiconductor layer is coupled to the conductive layer.

* * * * *